US 8,045,371 B2

(12) United States Patent
Lee et al.

(10) Patent No.: US 8,045,371 B2
(45) Date of Patent: Oct. 25, 2011

(54) MAGNETIC STORAGE DEVICE HAVING A BUFFER TRACK AND STORAGE TRACKS, AND METHOD OF OPERATING THE SAME

(75) Inventors: Sung-chul Lee, Osan-si (KR); Hyung-soon Shin, Seoul (KR); Seung-jun Lee, Seoul (KR); Sun-ae Seo, Hwaseong-si (KR); Young-jin Cho, Suwon-si (KR); Ung-hwan Pl, Seoul (KR); Ji-young Bae, Seongnam-si (KR); Jin-seong Heo, Daejeon (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 185 days.

(21) Appl. No.: 12/588,333

(22) Filed: Oct. 13, 2009

(65) Prior Publication Data
US 2010/0232055 A1 Sep. 16, 2010

(30) Foreign Application Priority Data
Mar. 16, 2009 (KR) .................. 10-2009-0022181

(51) Int. Cl.
*G11C 11/15* (2006.01)
(52) U.S. Cl. .......... 365/173; 365/171; 365/189.05; 365/189.08; 365/189.09; 365/130; 365/66; 365/51
(58) Field of Classification Search .......... 365/189.05, 365/189.09, 189.08, 173, 171, 158, 163, 365/130, 51, 66, 63
See application file for complete search history.

(56) References Cited

U.S. PATENT DOCUMENTS

| | | | |
|---|---|---|---|
| 7,796,415 B2 * | 9/2010 | Lee et al. | ............ 365/81 |
| 2004/0047172 A1 | 3/2004 | Komatsuzaki | |
| 2006/0108655 A1 | 5/2006 | Drewes | |
| 2007/0292973 A1 | 12/2007 | Drewes | |
| 2010/0232055 A1 * | 9/2010 | Lee et al. | ......... 360/77.01 |

FOREIGN PATENT DOCUMENTS

| | | |
|---|---|---|
| JP | 2000-100169 | 4/2000 |
| JP | 2008-102987 | 5/2008 |
| KR | 10-2006-0013476 | 2/2006 |
| KR | 10-2007-0084884 | 8/2007 |
| KR | 10-2008-0037949 | 5/2008 |

OTHER PUBLICATIONS

Luc Thomas, et al., "Oscillatory dependence of current-driven magnetic domain wall motion on currtent pulse length" Nature Letters, vol. 443, Sep. 14, 2006, 197-200.

* cited by examiner

*Primary Examiner* — Andrew Q Tran
(74) *Attorney, Agent, or Firm* — Harness, Dickey & Pierce, P.L.C.

(57) ABSTRACT

An information storage device includes a magnetic structure having a buffer track and a plurality of storage tracks connected to the buffer track. A write/read unit is disposed on the magnetic structure, and a plurality of switching devices are respectively connected to the buffer track, the plurality of storage tracks, and the write/read unit. The switching devices that are respectively connected to the buffer track and the storage tracks. The information storage device further includes a circuit configured to supply current to at least one of the magnetic structure and the write/read unit.

31 Claims, 22 Drawing Sheets

MAGNETIC STORAGE DEVICE HAVING A BUFFER TRACK AND STORAGE TRACKS, AND METHOD OF OPERATING THE SAME

CROSS-REFERENCE TO RELATED APPLICATION(S)

This application claims priority under 35 U.S.C. §119 to Korean Patent Application No. 10-2009-0022181, filed on Mar. 16, 2009, in the Korean Intellectual Property Office, the entire contents of which is incorporated herein by reference.

BACKGROUND

1. Field

The general inventive concept relates to information storage devices and methods of operating the same.

2. Description of the Related Art

Non-volatile information storage devices retain recorded information even when power is cut off. Examples of non-volatile information storage devices include hard disk drives (HDDs), non-volatile random access memories (RAMs), etc.

In general, conventional HDDs may wear down and experience operational failure due to a rotating mechanical device included in the HDD. As a result, conventional HDDs have relatively low reliability.

A representative example of a conventional non-volatile RAM is flash memory. Although conventional flash memories do not use a rotating mechanical device, conventional flash memories do have relatively low reading and writing speeds, relatively short lifetimes, and smaller storage capacities relative to conventional HDDs. Also, conventional flash memories have relatively high manufacturing costs.

Another type of information storage device uses movement of a magnetic domain wall of a magnetic material. A magnetic domain is a minute magnetic region formed of a ferromagnetic material, in which magnetic moments are arranged in a given direction. A magnetic domain wall is a border region between magnetic domains having different magnetization directions. The magnetic domain and the magnetic domain wall may be moved by supplying current to the magnetic material. By using the movement of the magnetic domain and the magnetic domain wall, an information storage device having a relatively large storage capacity without the need to use a rotating mechanical device may be realized.

SUMMARY

One or more example embodiments provide information storage devices using movement of magnetic domains and magnetic domain walls and methods of operating the same.

One or more example embodiments provide an information storage device including a magnetic structure and a write/read unit. The magnetic structure includes a buffer track and a plurality of storage tracks connected to the buffer track. Each of the buffer track and the plurality of storage tracks include a plurality of magnetic domains and magnetic domain walls between adjacent magnetic domains. The write/read unit is disposed on the magnetic structure. The information storage device according to at least this example embodiment further includes a plurality of switching devices and a circuit. The plurality of switching devices are connected to the buffer track, the storage tracks, and a first end of the write/read unit, respectively. The circuit is configured to control the switching devices and supply current to at least one of the magnetic structure and the write/read unit.

According to at least some example embodiments, the storage tracks may be connected in parallel to an end of the buffer track. The write/read unit may be disposed at an end of the buffer track or a region adjacent to the end of the buffer track. The magnetic structure may include a first magnetic track and at least one second magnetic track connected to the first magnetic track. A first portion of the first magnetic track may correspond to the buffer track. A second portion of the first magnetic track and the at least one second magnetic track may correspond to the plurality of storage tracks. The length of the at least one second magnetic track may be similar to or the same as the length of the first magnetic track. In this example, a central region or a region adjacent to the central region of the at least one second magnetic track may be connected to a central region or a region adjacent to the central region of the first magnetic track. Each of the at least one second magnetic tracks may correspond to two of the plurality of storage tracks.

According to at least some example embodiments, the length of the at least one second magnetic track may be similar to or the same as the length of the buffer track. In this example, an end of the at least one second magnetic track may be connected to a central region or a region adjacent to the central region of the first magnetic track. Each of the at least one second magnetic track may correspond to one of the plurality of storage tracks. The plurality of switching devices may be transistors.

Among the plurality of switching devices, switching devices connected to the buffer track and the plurality of storage tracks may also be connected to a first word line. A switching device connected to the write/read unit may also be connected to a second word line. A plurality of bit lines may intersect the first and second word lines, and may be respectively connected to the plurality of switching devices and a second end of the write/read unit.

According to at least some example embodiments, the circuit may include a first circuit unit connected to the first and second word lines, and a second circuit unit connected to the plurality of bit lines. The second circuit unit may include first through fourth signal generators. The first signal generator may be configured to supply a signal to a bit line connected to a switching device, which is further connected to the buffer track. The second signal generator may be configured to supply a signal to a bit line connected to a switching device, which is further connected to the first end of the write/read unit. The third signal generator may be configured to supply a signal to a bit line connected to the second end of the write/read unit. The fourth signal generator may be configured to supply a signal to bit lines connected to ones of the plurality of switching devices, which are further connected to the plurality of storage tracks.

The second circuit unit may include a selection circuit. The selection circuit may be configured to select a bit line to which a signal is supplied from the fourth signal generator from among the bit lines connected to the plurality of switching devices, which are further connected to the plurality of storage tracks.

The first and second signal generators may be configured to control a read operation performed on a first region of the magnetic structure on which the write/read unit is disposed. The second and third signal generators may be configured to control a write operation performed on the first region. The first and fourth signal generators may be configured to control movement of magnetic domain walls in the magnetic structure.

The first circuit unit may be configured to activate the first and second word lines for the read operation, configured to activate the second word line for the write operation, and configured to activate the first word line for moving the magnetic domain walls.

The first signal generator may include a first interconnecting wire, a first transistor, a second and a third transistor. The first interconnecting wire may be connected to the bit line corresponding to the switching device, which is further connected to the buffer track. The first moving-current source may be connected to the first interconnecting wire. The first transistor may be connected between the first moving-current source and the first interconnecting wire. The second and third transistors may be connected in parallel between the first interconnecting wire and ground. The first signal generator may further include first and second logic gates, and a first inverter. The first logic gate (e.g., an AND gate) may have an output terminal connected to the second transistor, and first and second input terminals. The second logic gate (e.g., an AND gate) may have an output terminal connected to the first transistor, and first and second input terminals. The first and second input terminals are respectively connected to the first and second input terminals of the first logic gate. The first inverter may be connected between the second input terminals of the first and second logic gates. Moving signals for moving the magnetic domain walls may be supplied to the first and second input terminals of the first logic gate, and a read signal may be supplied to a gate terminal of the third transistor.

The second signal generator may include a second interconnecting wire, a read current source, a first write current source, and fourth through sixth transistors. The second interconnecting wire may be connected to the bit line corresponding to the switching device, which is further connected to the write/read unit. The read current source and a first write current source may be connected in parallel to the second interconnecting wire. The fourth transistor may be connected between the read current source and the second interconnecting wire. The fifth transistor may be connected between the first write current source and the second interconnecting wire. The sixth transistor may be connected between the second interconnecting wire and ground. The second signal generator may further include a third and fourth logic gate, and a second inverter. The third logic gate (e.g., an AND gate) may have an output terminal connected to the sixth transistor, and first and second input terminals. The fourth logic gate (e.g., an AND gate) may have an output terminal connected to the fifth transistor, and first and second input terminals respectively connected to the first and second input terminals of the third logic gate. The second inverter may be connected between the second input terminals of the third and fourth logic gates. Write signals may be supplied to the first and second input terminals of the third logic gate, and a read signal may be supplied to a gate terminal of the fourth transistor.

The third signal generator may include a third interconnecting wire, a second write current source, and seventh and eighth transistors. The third interconnecting wire may be connected to the bit line connected to the second end of the write/read unit. The second write current source may be connected to the third interconnecting wire. The seventh transistor may be connected between the second write current source and the third interconnecting wire. The eighth transistor may be connected between the third interconnecting wire and ground. The third signal generator may further include a fifth and sixth logic gates, and a third inverter. The fifth logic gate (e.g., an AND gate) may have an output terminal connected to the seventh transistor, and first and second input terminals. The sixth logic gate (e.g., an AND gate) may have an output terminal connected to the eighth transistor, and first and second input terminals respectively connected to the first and second input terminals of the fifth logic gate. The third inverter may be connected between the first input terminals of the fifth and sixth logic gates. Write signals may be supplied to the first and second input terminals of the fifth logic gate.

The fourth signal generator may include a fourth interconnecting wire, a second moving-current source, and a ninth and a tenth transistor. The fourth interconnecting wire may be connected to the others of the plurality of bit lines corresponding to the switching devices connected to the plurality of storage tracks. The second moving-current source may be connected to the fourth interconnecting wire. The ninth transistor may be connected between the second moving-current source and the fourth interconnecting wire. The tenth transistor may be connected between the fourth interconnecting wire and ground. The fourth signal generator may further include seventh and eighth logic gates and a fourth inverter. The seventh logic gate (e.g., an AND gate) may have an output terminal connected to the ninth transistor, and first and second input terminals. The eighth logic gate (e.g., an AND gate) may have an output terminal connected to the tenth transistor, and first and second input terminals respectively connected to the first and second input terminals of the seventh logic gate. The fourth inverter may be connected between the first input terminals of the seventh and eighth logic gates. Moving signals for moving the magnetic domain walls may be supplied to the first and second input terminals of the seventh logic gate.

The first circuit unit may include a first logic gate and a second logic gate (e.g., OR gates). An output terminal of the first logic gate may be connected to the first word line. An output terminal of the second logic gate may be connected to the second word line. A moving signal and a read signal may be respectively supplied to first and second input terminals of the first logic gate, and a write signal and the read signal may be respectively supplied to first and second input terminals of the second logic gate.

The magnetic structure, the first and second word lines, the plurality of bit lines and the plurality of switching devices may form a unit memory region. A plurality of unit memory regions may form a memory array.

A first decoder may be connected between the first circuit unit and the memory array. A second decoder may be connected between the second circuit unit and the memory array.

Among the plurality of switching devices, a switching device connected to the buffer track may be connected to a first word line, a switching device connected to the write/read unit may be connected to a second word line, and others of the plurality of switching devices, which are connected to the plurality of storage tracks, may be connected to a third word line.

One or more example embodiments provide a method of operating an information storage device. The information storage device includes a magnetic structure and a write/read unit. The magnetic structure includes a buffer track and a plurality of storage tracks connected to the buffer track. Each of the buffer track and the plurality of storage tracks include a plurality of magnetic domains and magnetic domain walls between adjacent magnetic domains. The write/read unit is disposed on the magnetic structure. The information storage device according to at least this example embodiment further includes a plurality of switching devices and a circuit. The plurality of switching devices are connected to the buffer track, the storage tracks, and a first end of the write/read unit, respectively. The circuit is configured to control the switching devices and supply current to at least one of the magnetic structure and the write/read unit.

According to at least this example embodiment, at least one of the plurality of switching devices is activated and current is supplied to at least one of the magnetic structure and the write/read unit. The supplied current may be read current, write current, or moving current for moving the magnetic domain walls of the magnetic structure. The moving current may be supplied between the buffer track and one of the plurality of storage tracks. The plurality of switching devices may be transistors.

Among the plurality of switching devices, switching devices connected to the buffer track and the plurality of storage tracks may be connected to a first word line. A switching device connected to the first end of the write/read unit may be connected to a second word line. A plurality of bit lines may be arranged to intersect the first and second word lines. The plurality of bit lines may be connected to the switching devices and a second end of the write/read unit, respectively.

The circuit may include a first circuit unit connected to the first and second word lines, and a second circuit unit connected to the plurality of bit lines. The second circuit unit may include first through fourth signal generators. The first signal generator may be configured to supply a signal to a bit line connected to the buffer track. The second signal generator may be configured to supply a signal to a bit line connected to a switching device, which is further connected to the first end of the write/read unit. The third signal generator may be configured to supply a signal to a bit line connected to the second end of the write/read unit. The fourth signal generator may be configured to supply a signal to a bit line selected from among the other bit lines connected to switching devices, which are connected to the plurality of storage tracks.

A read operation performed on a first region of the magnetic structure on which the write/read unit is disposed, may be controlled by the first and second signal generators. A write operation performed on the first region may be controlled by the second and third signal generators. Movement of magnetic domain walls of the magnetic structure may be controlled by the first and fourth signal generators.

The first circuit unit may activate the first and second word lines, and the second circuit unit may control a read current to be supplied to the first signal generator from the second signal generator via the write/read unit. The first circuit unit may activate the second word line, and the second circuit unit may control a write current to be supplied from one of the second and third signal generators to the other second or third signal generator via the write/read unit.

The first circuit unit may activate the first word line, the second circuit unit may control a moving current to be supplied from one of the first and fourth signal generators to the other first or fourth signal generator via the magnetic structure, and the moving current may be supplied between the buffer track and one of the storage tracks.

At least one other example embodiment provides an information storage device including a magnetic structure and a first unit. The magnetic structure includes a first magnetic track and at least one second magnetic track. The first magnetic track has a plurality of first magnetic domains and a first magnetic domain wall between each pair of adjacent first magnetic domains. The at least one second magnetic track has a plurality of second magnetic domains and a second magnetic domain wall between each pair of adjacent second magnetic domains. The at least one second magnetic track is arranged one of above or below the first magnetic track and connected to the first magnetic track. The first unit is configured to at least one of read and write information from and to the magnetic structure.

According to at least some example embodiments, the information storage device further includes a plurality switching devices. Each of the plurality of switching devices may be connected to a corresponding one of the first and at least one second magnetic tracks.

A first switching device may be connected between the first unit and a first bit line, and the plurality of switching devices may include second through fifth switching devices. The second switching device may be connected between a first end of the first magnetic track and a second bit line. The third switching device may be connected between a second end of the first magnetic track and a third bit line. The fourth switching device may be connected between a first end of the at least one second magnetic track and a fourth bit line. The fifth switching device may be connected between a second end of the at least one second magnetic track and a fifth bit line. A first word line may be connected to gates of each of the second through fifth switching devices, and a second word line may be connected to a gate of the first switching device.

According to at least some example embodiments, the first magnetic track may include a buffer track and a first storage track, and the at least one second magnetic track may include at least a second and a third storage track. The second and third storage tracks may be part of the same magnetic track. The second storage track may be arranged above the buffer track, and the third storage track may be arranged above the first storage track.

According to at least some example embodiments, the first magnetic track may include a buffer track and a first storage track, and the at least one second magnetic track may include at least a second and a third storage track. The second storage track may be arranged above the first storage track and the third storage track may be arranged below the first storage track.

At least one other example embodiment provides a memory device. The memory device includes a plurality of information storage devices and a control circuit. Each of the information storage devices includes a magnetic structure and a first unit. The magnetic structure includes a first magnetic track and at least one second magnetic track. The first magnetic track has a plurality of first magnetic domains and a first magnetic domain wall between each pair of adjacent first magnetic domains. The at least one second magnetic track has a plurality of second magnetic domains and a second magnetic domain wall between each pair of adjacent second magnetic domains. The at least one second magnetic track is arranged one of above or below the first magnetic track and connected to the first magnetic track. The first unit is configured to at least one of read and write information from and to the magnetic structure. The control circuit is configured to control the plurality of information storage devices.

According to at least some example embodiments, the control circuit may include a row decoder and a column decoder. The row and column decoder may be configured to select an information storage device among the plurality of information storage devices for operation. The control circuit may further include a first peripheral circuit connected to and configured to control the row decoder, and a second peripheral circuit connected to and configured to control the column decoder. The second peripheral circuit may include a plurality of signal generators connected to the column decoder via respective column wires.

According to at least some example embodiments, each of the plurality of information storage devices may further include a plurality switching devices, each of the plurality of switching devices may be connected to a corresponding one of the first and at least one second magnetic tracks.

BRIEF DESCRIPTION OF THE DRAWINGS

The general inventive concept will become apparent and more readily appreciated from the following description of example embodiments, taken in conjunction with the accompanying drawings in which.

DETAILED DESCRIPTION

Figure 1:
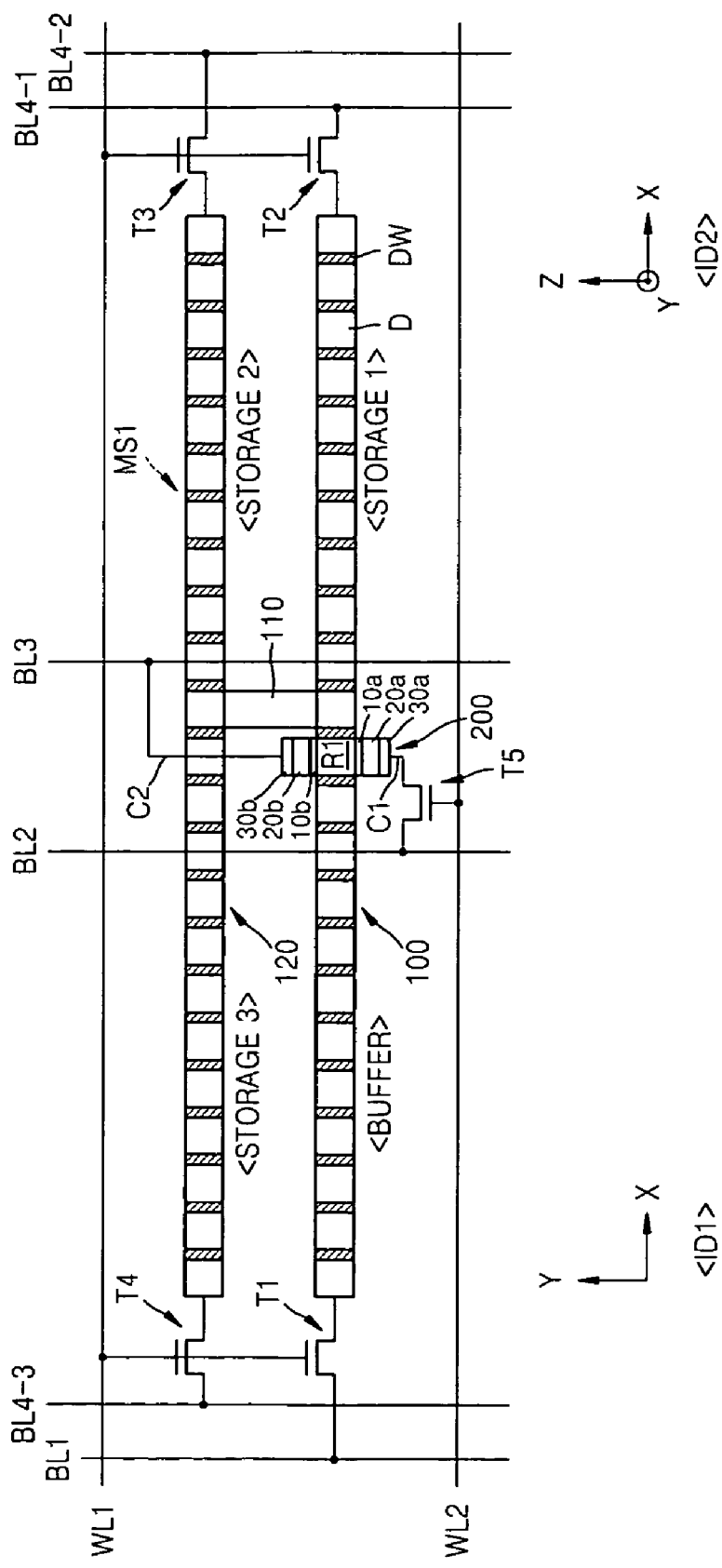
FIG. 1 is a circuit diagram of an example embodiment of an information storage device.

Various example embodiments will now be described more fully with reference to the accompanying drawings in which some example embodiments are shown.

Detailed illustrative example embodiments are disclosed herein. However, specific structural and functional details disclosed herein are merely representative for purposes of describing example embodiments. This invention may, however, may be embodied in many alternate forms and should not be construed as limited to only the example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the invention.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or," includes any and all combinations of one or more of the associated listed items.

It will be understood that when an element or layer is referred to as being "formed on," another element or layer, it can be directly or indirectly formed on the other element or layer. That is, for example, intervening elements or layers may be present. In contrast, when an element or layer is referred to as being "directly formed on," to another element, there are no intervening elements or layers present. Other words used to describe the relationship between elements or layers should be interpreted in a like fashion (e.g., "between," versus "directly between," "adjacent," versus "directly adjacent," etc.).

The terminology used herein is for the purpose of describing particular embodiments only and is not intended to be limiting of example embodiments. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Hereinafter, various example embodiments of an information storage device and a method of operating the same will be described more fully with reference to the accompanying drawings. In the drawings, the thicknesses of layers and regions are exaggerated for clarity. Like reference numerals denote like elements throughout the drawings.

FIG. 1 is a circuit diagram of an example embodiment of an information storage device. In FIG. 1, a first direction indicator ID1 indicates directions of first and second word lines WL1 and WL2 and first through fourth bit lines BL1 to BL4. A second direction indicator ID2 indicates directions of a magnetic structure MS1 and a first unit 200.

Referring to the example embodiment shown in FIG. 1, the magnetic structure MS1 includes a plurality of magnetic tracks 100 and 120 connected to one another. As discussed herein, magnetic tracks 100 and 120 are referred to as first magnetic track 100 and second magnetic track 120. Each of the first and second magnetic tracks 100 and 120 may include a plurality of magnetic domain regions D. A magnetic domain wall region DW is arranged between each pair of adjacent magnetic domain regions D.

The first and second magnetic tracks 100 and 120 may be formed of a ferromagnetic material including at least one of Co, Ni, Fe, or the like. The ferromagnetic material may further include a material other than Co, Ni, and Fe. The length of the first magnetic track 100 may be the same as or similar to that of the second magnetic track 120. The first and second magnetic tracks 100 and 120 may be arranged in parallel.

In FIG. 1, the second magnetic track 120 is disposed above the first magnetic track 100, and a connection layer 110 is disposed between the first and second magnetic tracks 100 and 120. The connection layer 110 may have the same or substantially the same width as each of the magnetic domain regions D. In the example embodiment shown in FIG. 1, the connection layer 110 is disposed between center regions or near center regions of the first and second magnetic tracks 100 and 120. The connection layer 110 may be formed of, but is not limited to, the same material as the first and/or second magnetic tracks 100 and/or 120. Alternatively, the connection layer 110 may be formed of a material having a magnetic anisotropic energy lower than that of the first and/or second magnetic tracks 100 and/or 120. Although not shown in FIG. 1, according to at least some example embodiments, the magnetic structure MS1 may have three or more magnetic tracks.

Still referring to the example embodiment shown in FIG. 1, the first unit 200 is disposed on a selected region R1 of the first magnetic track 100. In FIG. 1, the region R1 is adjacent to the connection layer 110. Hereinafter, the region R1 is referred to as 'first region R1'. The first region R1 may be one of the plurality of magnetic domain regions D or the leftmost magnetic domain region D of the connection layer 110. The first region R1 may be a center region of, or a region adjacent to the center region of, the first magnetic track 100.

The first unit 200 may be a device for writing/reading information. For example, the first unit 200 may be a device using the tunnel magneto resistance (TMR) effect or the giant magneto resistance (GMR) effect.

In the example embodiment shown in FIG. 1, the first unit 200 includes a first pinned layer 20a formed on the bottom surface of the first region R1. Although the first pinned layer 20a is formed on the bottom surface of the first region R1 in FIG. 1, the first pinned layer 20a may be formed on either one of the top and bottom surfaces. The first unit 200 further includes a first separation layer 10a between the first region R1 and the first pinned layer 20a.

Still referring to FIG. 1, the first unit 200 also includes a second pinned layer 20b on the top surface of the first region R1. Although the second pinned layer 20b is formed on the top surface of the first region R1 in FIG. 1, the second pinned layer 20b may be formed on either of the top and bottom surfaces of the first region R1. A second separation layer 10b is arranged between the first region R1 and the second pinned layer 20b. Magnetization directions of the first pinned layer 20a and the second pinned layer 20b may be opposite to each other.

The first and second separation layers 10a and 10b may be insulating layers or conductive layers. If the first and second separation layers 10a and 10b are insulating layers, the first unit 200 is a TMR device. If the first and second separation layers 10a and 10b are conductive layers, the first unit 200 is a GMR device. If the first and second separation layers 10a and 10b are conductive layers, a resistive layer (not shown) may be formed between the first and second separation layers 10a and 10b and the first region R1. The resistive layer may have a higher electrical resistance than the first region R1.

Still referring to FIG. 1, a first electrode 30a is formed at a bottom surface of the first pinned layer 20a, and a second electrode 30b is formed at a top surface of the second pinned layer 20b. In addition, a free layer (not shown) may also be formed between the first pinned layer 20a and the first separation layer 10a and/or between the second pinned layer 20b and the second separation layer 10b. In this case, an additional separation layer (not shown) may also be included between the free layer and the corresponding first and/or second pinned layers 20a and/or 20b. Although not expressly discussed herein, the first unit 200 may be constructed in various ways.

In the example embodiment shown in FIG. 1, the region of the first magnetic track 100 located at the left side of the first unit 200 serves as a temporary storage region (e.g., a buffer region BUFFER). The other region (STORAGE 1) of the first magnetic track 100 located on the right side of the first unit 200 serves as an effective storage region. The entire second magnetic track 120 may serve as an effective storage region. Said another way, for example, the entire magnetic structure MS1, except for the buffer region BUFFER, may serve as an effective storage region. The buffer region BUFFER may occupy half or about half of the first magnetic track 100. Hereinafter, in FIG. 1 the portion of the first magnetic track 100 located to the right of the first unit 200 is referred to as a 'first storage region STORAGE1'. Similarly, the right half and the left half of the second magnetic track 120 are referred to herein as a 'second storage region STORAGE2' and a 'third storage region STORAGE3', respectively. The lengths of the first through third storage regions STORAGE1 to STORAGE3 and the buffer region BUFFER may be the same or similar to one another.

According to at least some example embodiments, the magnetic structure MS1 may have a structure in which the first through third storage regions STORAGE1 to STORAGE3 share the buffer region BUFFER. For example, in the magnetic structure MS1 shown in FIG. 1, the first through third storage regions STORAGE1 to STORAGE3 are connected in parallel to an end of the buffer region BUFFER. The first unit 200 is disposed on an end of or a region adjacent to an end of the buffer region BUFFER.

First through fifth switching devices T1 to T5 are connected to ends of the first and second magnetic tracks 100 and 120, and one end of the first unit 200. More specifically, in this example embodiment the first switching device T1 is connected to the buffer region BUFFER, and the second to fourth switching devices T2 to T4 are connected to the first through third storage regions STORAGE1 to STORAGE3, respectively. The fifth switching device T5 is connected to a bottom surface of the first unit 200. The first to fifth switching devices T1 to T5 may be transistors or similar switching devices.

In the example embodiment shown in FIG. 1, a first word line WL1 is commonly connected to gates of the first to fourth switching devices T1 to T4. A second word line WL2 is separated from the first word line WL1 and connected to a gate of the fifth switching device T5. The first and second word lines WL1 and WL2 are arranged in parallel with the first and second magnetic tracks 100 and 120. A plurality of bit lines BL1 to BL3, BL4-1, BL4-2 and BL4-3 intersect the first and second word lines WL1 and WL2, for example, in the vertical direction.

Still referring to FIG. 1, the first bit line BL1 is connected to the first switching device T1 and the second bit line BL2 is connected to the fifth switching device T5. The third bit line BL3 is connected to a top surface of the first unit 200. The fourth bit lines BL4-1, BL4-2 and BL4-3 are respectively connected to the second to fourth switching devices T2 to T4. The first electrode 30a of the first unit 200 and the fifth switching device T5 are connected via a first conducting wire C1. The second electrode 30b of the first unit 200 and the third bit line BL3 are connected via a second conducting wire C2.

The first electrode 30a may be considered part of the first unit 200 or part of the first conducting wire C1. Similarly, the second electrode 30b may be considered part of the first unit 200 or part of the second conducting wire C2.

The positions of the first bit line BL1 and the fourth bit line BL4-3 may be switched with each other, and those of the fourth bit lines BL4-1 and BL4-2 may be switched with each other. The position of the fifth switching device T5 may also be changed. For example, the fifth switching device T5 may be connected to the second electrode 30b (e.g., the top surface of the first unit 200) rather than the first electrode 30a (e.g., the bottom surface of the first unit 200). In this case, the fifth switching device T5 may be connected to the third bit line BL3 rather than the second bit line L2. In some cases, the first to fifth switching devices T1 to T5 may be switching devices (e.g., diodes) other than transistors.

Figure 2:
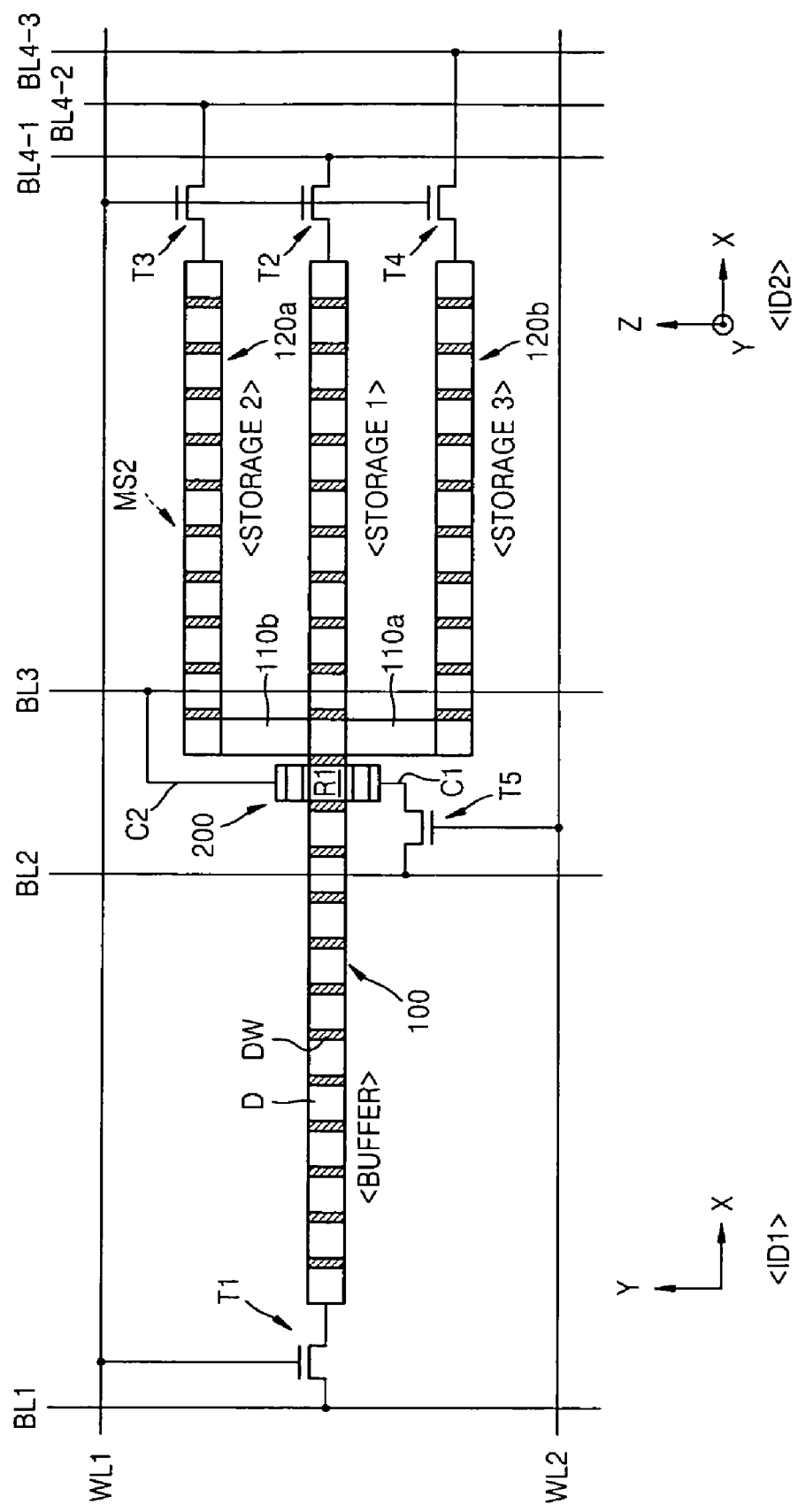
FIG. 2 is a circuit diagram of another example embodiment of an information storage device.

FIG. 2 is a circuit diagram of another example embodiment of an information storage device. The information storage device in FIG. 2 includes a first magnetic track and at least one additional magnetic track.

Referring to FIG. 2, according to this example embodiment the magnetic structure MS2 includes a first through third magnetic tracks 100, 120a and 120b. The second and third magnetic tracks 120a and 120b are connected to the first magnetic track 100. The lengths of the second and third magnetic tracks 120a and 120b may be less than (e.g., about half of) the length of the first magnetic track 100.

As shown in FIG. 2, the second and third magnetic tracks 120a and 120b are disposed in parallel with the first magnetic track 100. For example, in FIG. 2 the second and third magnetic tracks 120a and 120b are respectively disposed above and below the first storage region STORAGE1. In this case, first ends of the second and third magnetic tracks 120a and 120b may be connected to a central region of, or a region adjacent to the central region of, the first magnetic track 100.

A connection layer 110a is disposed between the first end of the second magnetic track 120a and the first magnetic track 100. A connection layer 110b is disposed between the first end of the third magnetic track 120b and the first magnetic track 100. The connection layers 110a and 110b may be the same or substantially the same as the connection layer 110 of FIG. 1. In the magnetic structure MS2, the second and third magnetic tracks 120a and 120b are referred to and serve as second and third storage regions STORAGE2 and STORAGE3, respectively.

The magnetic structure MS2 of FIG. 2 may be differentiated from the magnetic structure MS1 of FIG. 1 in terms of the position of the third storage region STORAGE3.

In an alternative example embodiment, the third storage region STORAGE3 may be disposed above the second storage region STORAGE2. In this alternative embodiment, the third magnetic track 120b is disposed above the second magnetic track 120a. Also, the first magnetic track 100 may be connected to three or more magnetic tracks.

Still referring to FIG. 2, a buffer region BUFFER is connected to a first switching device T1. And, the first to third storage regions STORAGE1 to STORAGE3 are connected to second to fourth switching devices T2 to T4, respectively. A first unit 200 is connected to a fifth switching device T5. The first to fourth switching devices T1 to T4 are connected to a first word line WL1 and the fifth switching device T5 is connected to a second word line WL2.

A plurality of bit lines BL1, BL2, BL3, BL4-1, BL4-2, and BL4-3 intersect the first and second word lines WL1 and WL2. The first to fifth switching devices T1 to T5 are connected to the bit lines BL1, BL2, BL3, BL4-1, BL4-2, and BL4-3 as described above with reference to FIG. 1, except that the position of the fourth bit line BL4-3 connected to the third storage region STORAGE3 is changed because the position of the third storage region STORAGE3 is different than that illustrated in FIG. 1.

In the example embodiments illustrated in FIGS. 1 and 2, the first unit 200 includes two pinned layers 20a and 20b. But, the first unit 200 may be modified to include a single pinned layer. In this case, one of the pinned layers 20a and 20b may be omitted. A separation layer 10a or 10b corresponding to the omitted pinned layer 20a or 20b may also be omitted. In addition, one of two electrodes 30a and 30b (e.g., the second electrode 30b) may be disposed on a first region R1. A resistive layer (not shown) may be formed between the second electrode 30b and the first region R1. The resistive layer may have a higher electrical resistance than the first magnetic track 100.

An example embodiment of a method of writing information using the first unit 200 of FIG. 1 will now be described in detail with reference to FIGS. 3A and 3B.

Figure 3A:
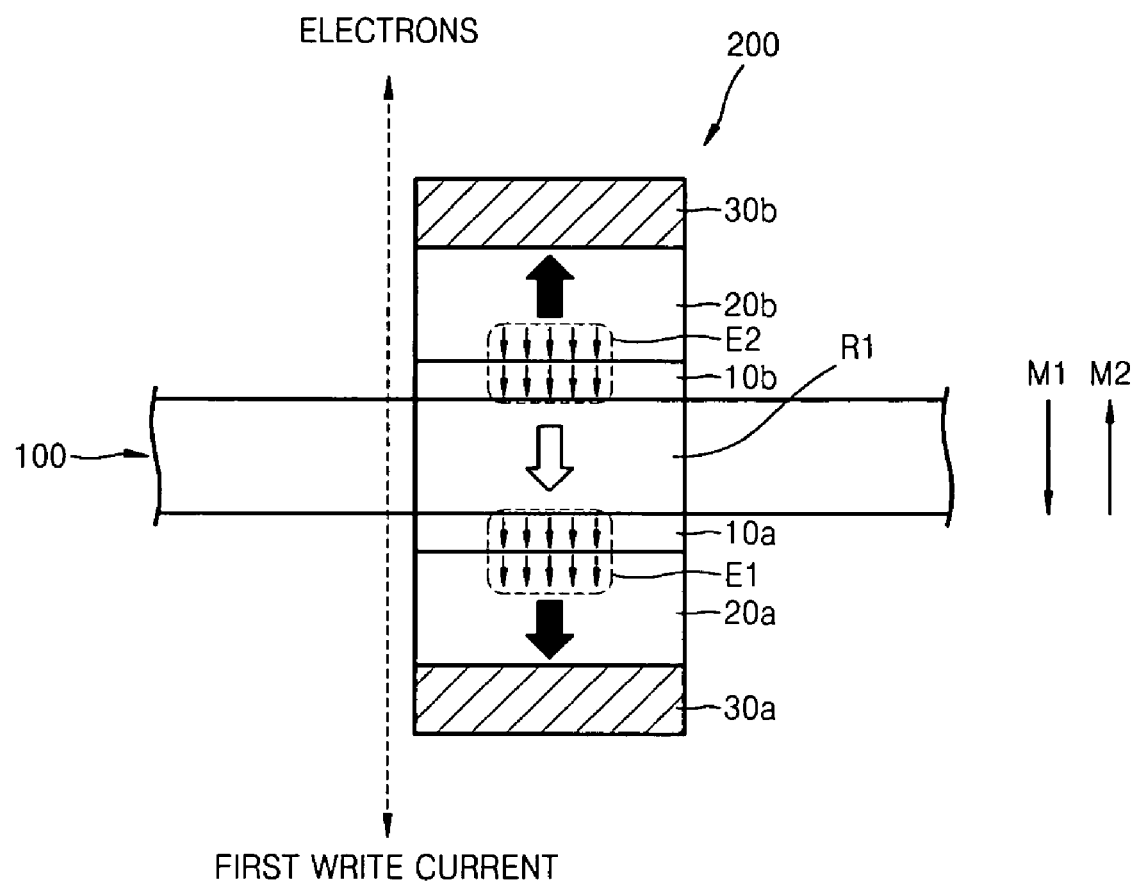
FIGS. 3A and 3B are cross-sectional views illustrating an example embodiment of a method of writing information by a first unit of an information storage device.
Figure 3B:
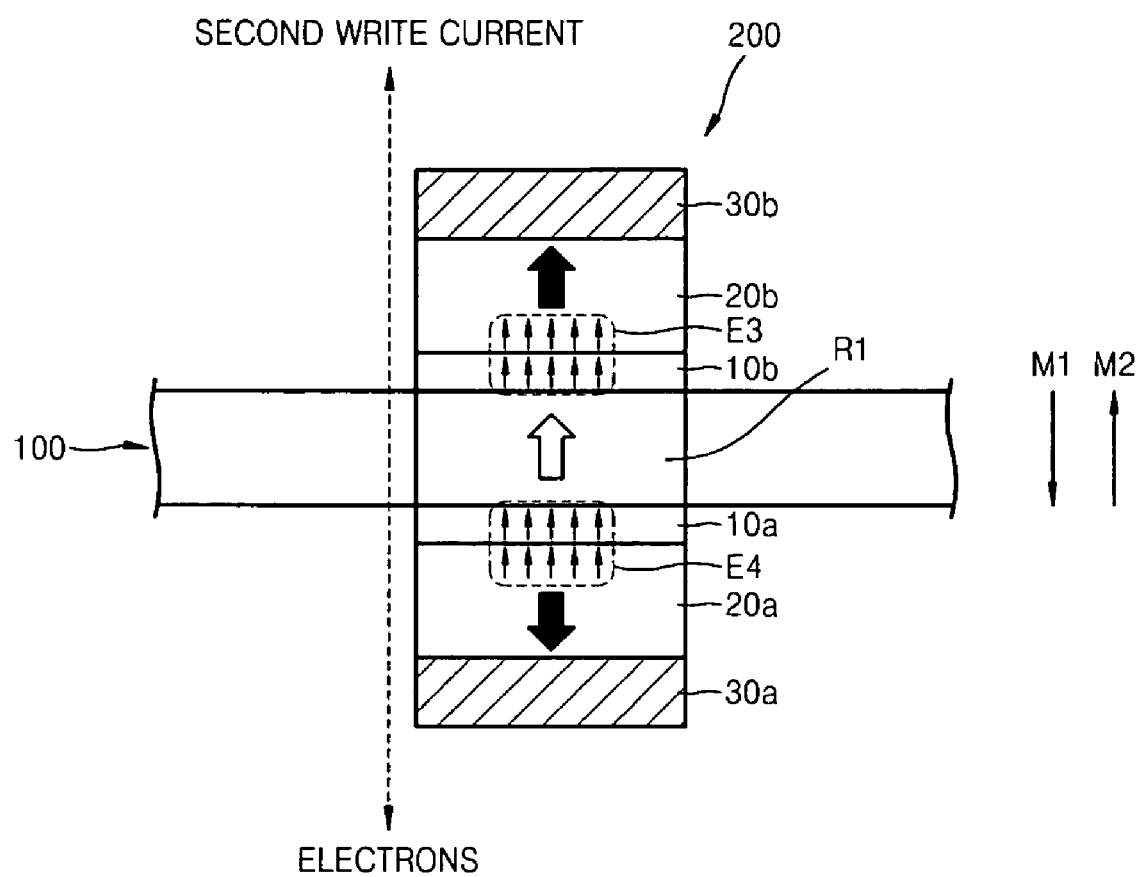

FIGS. 3A and 3B are partial cross-sectional views of the information storage device of FIG. 1. In FIGS. 3A and 3B, the first and second pinned layers 20a and 20b and the first magnetic track 100 have vertical magnetic anisotropy, and the first and second pinned layers 20a and 20b are magnetized in a first direction M1 and a second direction M2, respectively. Also, the first and second pinned layers 20a and 20b and the first magnetic track 100 have horizontal magnetic anisotropy.

Referring to FIG. 3A, electrons move from the first electrode 30a to the second electrode 30b in response to a first write current supplied from the second electrode 30b to the first electrode 30a. In so doing, electrons E1 magnetized in the same direction as the first pinned layer 20a (e.g., first direction M1) move from the first electrode 30a to the first region R1. The movement of the electrons E1 allows the first region R1 to be magnetized in the first direction M1. In the second pinned layer 20b, electrons magnetized in the same direction as the second pinned layer 20b (e.g., second direction M2) are discharged to the second electrode 30b via the second pinned layer 20b. However, electrons E2 magnetized in a direction opposite to the magnetization direction of the second pinned layer 20b are not discharged to the second electrode 30b via the second pinned layer 20b. Instead, these electrons E2 return back to, and are accumulated in, the first region R1. The movement of the electrons E2 allows the first region R1 to be magnetized in the first direction M1.

As described above, the first region R1 may be magnetized in the first direction M1 by spin transfer torque applied from the first pinned layer 20a and the second pinned layer 20b to the first region R1. If the first region R1 is magnetized in the second direction M2 before the first write current is applied, the magnetization direction of the first region R1 may change from the second direction M2 to the first direction M1 by applying the first write current.

Referring to FIG. 3B, electrons move from the second electrode 30b to the first electrode 30a in response to a second write current supplied from the first electrode 30a to the second electrode 30b. In so doing, electrons E3 magnetized in the same direction as the second pinned layer 20b (e.g., second direction M2) move from the second electrode 30b to the first region R1. The movement of the electrons E3 allows the first region R1 to be magnetized in the second direction M2. In the first pinned layer 20a, electrons magnetized in the same direction as the first pinned layer 20a (e.g., first direction M1) are discharged to the first electrode 30a via the first pinned layer 20a. But, electrons E4 magnetized in a direction opposite to the magnetization direction (e.g., second direction M2) of the first pinned layer 20a are not discharged to the first electrode 30a via the first pinned layer 20a. Instead, the electrons E4 return back to, and are accumulated in, the first region R1. The movement of the electrons E4 allows the first region R1 to be magnetized in the second direction M2.

If the first region R1 is magnetized in the first direction M1 before the second write current is applied, the magnetization direction of the first region R1 may change from the first direction M1 to the second direction M2 by applying the second write current.

As described above, in the information storage device according to at least this example embodiment, the first pinned layer 20a and the second pinned layer 20b having opposite magnetization directions are respectively formed on bottom and top surfaces of the first magnetic track 100. Thus, information may be written by spin transfer torque induced by both the first and second pinned layers 20a and 20b. If one of the first and second pinned layers 20a and 20b is omitted, information may be written by spin transfer torque applied from the remaining first or second pinned layer 20a or 20b to the first region R1.

Before, after or between the operations illustrated in FIGS. 3A and 3B, magnetic domains and magnetic domain walls may be moved by one bit within the first magnetic track 100 in a selected direction by applying a current to the first magnetic track 100. A relatively large amount of information may be written to the first magnetic track 100 by magnetizing a magnetic domain located on the first region R1 in a desired direction as described above with reference to FIG. 3A or 3B while moving the magnetic domains and the magnetic domain walls within the first magnetic track 100 in the units of bits.

For example, it is possible to write selected information by moving the magnetic domains and magnetic domain walls in the first storage region STORAGE1 of FIG. 1 to the buffer region BUFFER. After completing the writing, the information written to the buffer region BUFFER may be moved back to the first storage region STORAGE1. Alternatively, it is possible to write selected information by moving the magnetic domains and magnetic domain walls in the second or third storage region STORAGE2 or STORAGE3 of FIG. 1 to the buffer region BUFFER. Similarly, after completing the writing, the information written to the buffer region BUFFER may be moved back to the second or third storage region STORAGE2 or STORAGE3, In addition to writing, reading may also be performed using the first unit 200 of FIG. 1. Briefly, the type of information written to the first region R1 may be determined by supplying a read current to the first unit 200. In this example, the read current may be supplied between one of the first electrode 30a and the second electrode 30b and an end of the first magnetic track 100. Alternatively, the read current may be supplied between one of the first electrode 30a and the second electrode 30b and an end of the second magnetic track 200. The amount of the read current may vary according to the information written to the first region R1 including the first unit 200.

The read current may not be influenced (e.g., greatly influenced) by the state of magnetization of the other magnetic domain regions D except for the first region R1. For example, the magnetization state of the first region R1 including the first unit 200 may be a dominant factor in determining the amount of the read current. Thus, the type of the information written to the first region R1 may be determined by supplying the read current. A relatively large amount of information written to the magnetic structure MS1 may be determined by reading the information from the first region R1 while moving the magnetic domains and the magnetic domain walls by one bit (e.g., bit-by-bit). For example, information may be read from the magnetic domains in the first storage region STORAGE1 while moving the magnetic domains and magnetic domain walls in the first storage region STORAGE1 to the buffer region BUFFER. After reading, the information in the buffer region BUFFER may be moved back to the first storage region STORAGE1. Alternatively, information may be read from the magnetic domains in the second or third storage region STORAGE2 or STORAGE3 while moving the magnetic domains and magnetic domain walls in the second or third storage region STORAGE2 or STORAGE3 to the buffer region BUFFER. Similarly, after reading, the information in the buffer region BUFFER may be moved back to the second or third storage region STORAGE2 or STORAGE3.

An example embodiment of a method of operating an information storage device, such as that shown in FIG. 1, will now be described in greater detail with reference to FIGS. 4 to 6.

Figure 4:
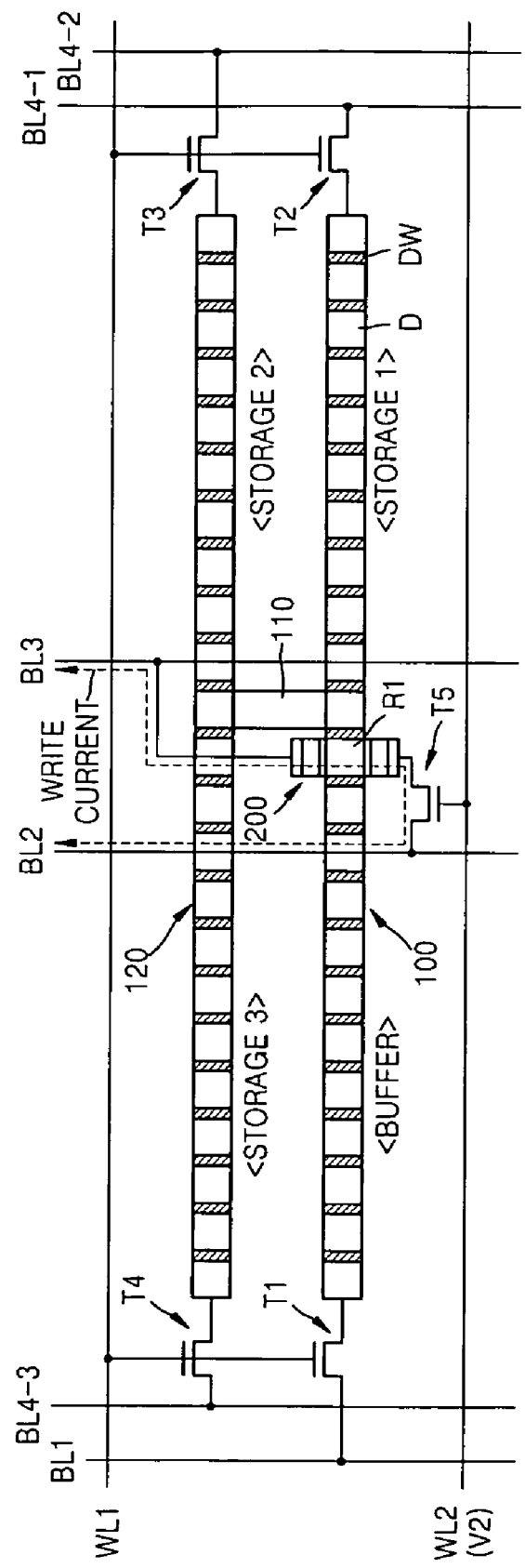
FIGS. 4 to 6 are circuit diagrams illustrating an example embodiment of a method of operating an information storage device.

Referring to FIG. 4, while a fifth switching device T5 is turned on by activating a second word line WL2 (e.g., by applying a selected voltage V2 to the second word line WL2), a write current is supplied to a first unit 200 via a second bit line BL2 and a third bit line BL3. The type of information that is to be written to the first region R1 may be determined by a direction of the write current.

Figure 5:
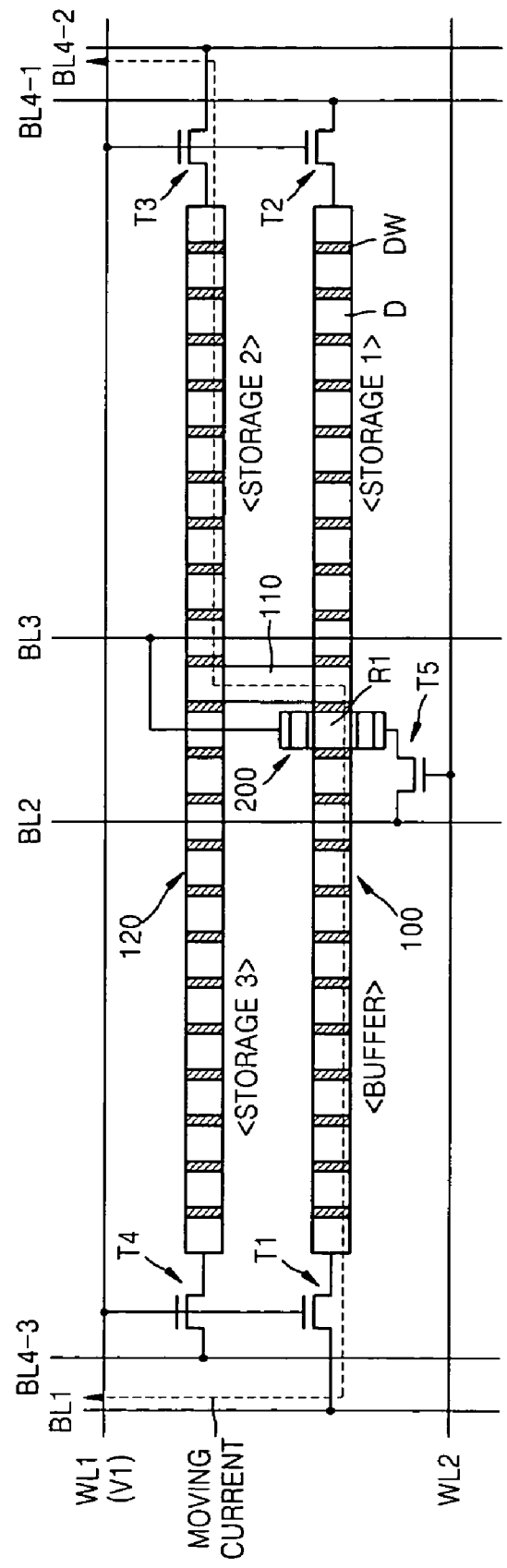

Referring to FIG. 5, while first through fourth switching devices T1 to T4 are turned on by activating a first word line WL1 (e.g., by applying a selected voltage V1 to the first word line WL1), a moving current (pulse current) is supplied to a magnetic structure MS1 via the first bit line BL1 and one of fourth bit lines BL4-1, BL4-2 and BL4-3. For example, the moving current may be supplied between the fourth bit line BL4-2 and the first bit line BL1. In this case, the moving current is supplied between a buffer region BUFFER and a second storage region STORAGE2, and magnetic domains and magnetic domain walls move from the second storage region STORAGE2 to the buffer region BUFFER and vice versa. A direction in which the magnetic domains and magnetic domain walls move within the magnetic structure MS1 may vary according to the direction of the current. Because current flows in a direction opposite to that in which electrons move, the magnetic domains and the magnetic domain walls move in a direction opposite to that in which the current flows.

By repeatedly and alternately performing the operations described above with reference to FIGS. 4 and 5, selected information may be written to magnetic domain regions D in the second storage region STORAGE2 while moving the magnetic domain regions D from the second storage region STORAGE2 to the buffer region BUFFER. After completing the writing, the information in the buffer region BUFFER may be moved back to the second storage region STORAGE2.

Figure 6:
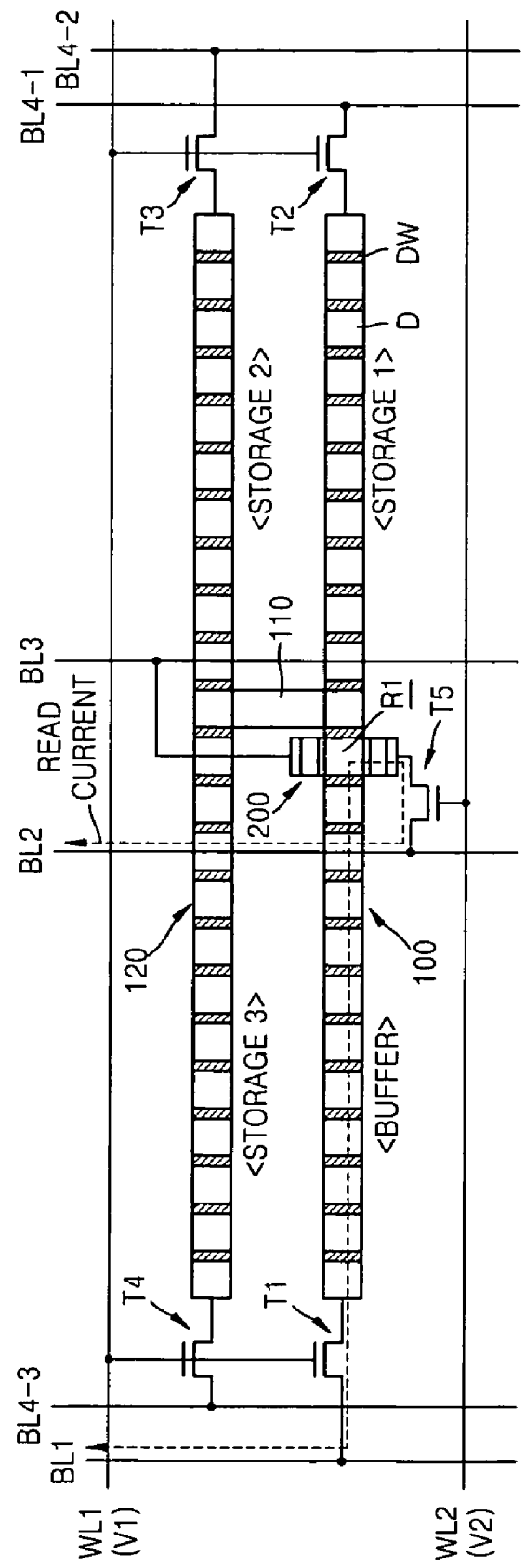

Referring to FIG. 6, to read stored information (or data), a read current is supplied between the first bit line BL1 and the second bit line BL2 while the first to fifth switching devices T1 to T5 are turned on in response to selected voltages V1 and V2 applied to the first and second word lines WL1 and WL2. The read current may flow via a part of the first unit 200 (a lower portion of the first region R1) and the first region R1, and the amount of the read current may be influenced (e.g., greatly influenced) by a direction of magnetization of the first region R1. For example, an electrical resistance between the first bit line BL1 and the second bit line BL2 may change relatively significantly according to the direction of magnetization of the first region R1. Thus, the type of information written to the first region R1 may be determined by applying the read current. The magnitude of the read current is less than that of the above write current, and thus, may not change the direction of magnetization of the first region R1. Reading may be performed by supplying a read current between the second bit line BL2 and one of the fourth bit lines BL4-1, BL4-2 and BL4-3 rather than by supplying the read current to the first bit line BL1 and the second bit line BL2. Also, if the fifth switching device T5 is connected to the third bit line BL3 rather than the second bit line BL2, reading may be performed by supplying the read current between the first and third bit lines BL1 and BL3 or between the third bit line BL3 and one of the fourth bit lines BL4-1, BL4-2 and BL4-3.

According to at least one example embodiment, information may be read from the first region R1 by supplying the read current between an end of the first unit 200 and an end of the first and second magnetic tracks 100 and 120. As described above, in at least this example embodiment, the first unit 200 may be used as a device for reading information. Thus, the first unit 200 may be referred to as a writing/reading unit capable of performing both a write operation and a read operation. Alternatively, a writing unit and a reading unit may be separate units or devices.

The read operation of FIG. 6 and the moving operation of FIG. 5 may be repeatedly and/or alternately performed. In this way, it is possible to read information from magnetic domains located at one side of the first unit 200 while moving these magnetic domain regions D toward the other side of the first unit 200. For example, information may be read from one of the first to third storage regions STORAGE1 to STORAGE3 while moving this information to the buffer region BUFFER. After completing the reading, the information moved to the buffer region BUFFER may be returned back to the original position (e.g., to one of the first to third storage regions STORAGE1 to STORAGE3).

A write operation and a read operation performed by the information storage device of FIG. 2 may be similar to those performed as described above with reference to FIGS. 4 to 6. Thus, a detailed description is omitted.

Figure 7:
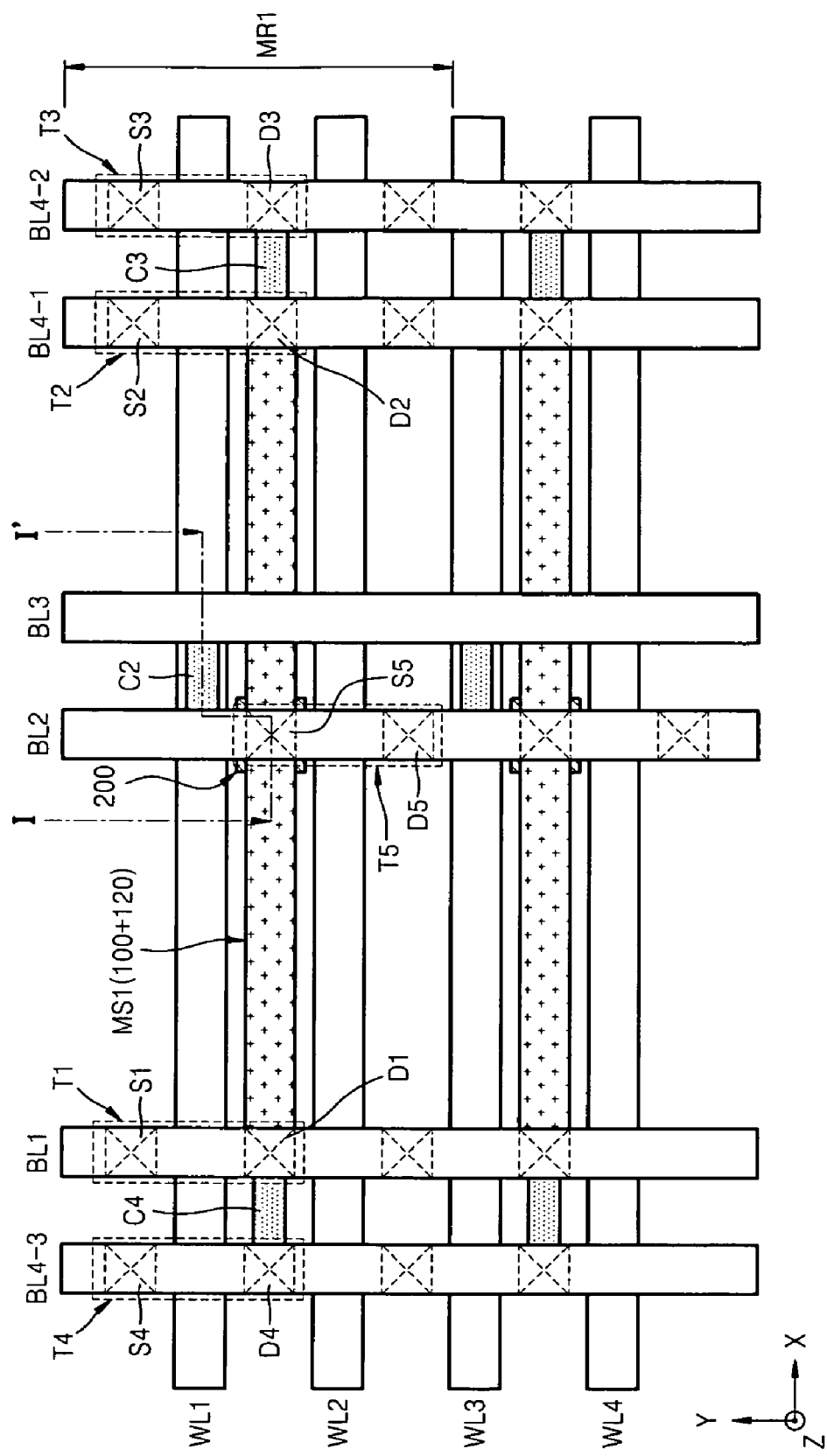
FIG. 7 is a layout diagram of an example embodiment of an information storage device.

FIG. 7 is a layout diagram of an information storage device according to another example embodiment.

Referring to the example embodiment shown in FIG. 7, the information storage device includes first through fourth word lines WL1 to WL4. The information storage device also includes a plurality of bit lines BL1, BL2, BL3, BL4-1, BL4-2 and BL4-3 intersecting the first through fourth word lines WL1 to WL4. A magnetic structure MS1 is disposed between the first and second word lines WL1 and WL2. The magnetic structure MS1 includes a first magnetic track 100 and a second magnetic track 120, similar to the magnetic structure MS1 illustrated in FIG. 1.

A first switching device T1 is disposed at or near a location where the first word line WL1 intersects the first bit line BL1. The first switching device T1 includes a first source S1 and a first drain D1, which are disposed at respective sides of the first word line WL1. The first source S1 and the first drain D1 of the first switching device T1 are respectively connected to the first bit line BL1 and a first end of the first magnetic track 100.

A second switching device T2 is disposed at or near a location where the first word line WL1 intersects the fourth bit line BL4-1. The second switching device T2 includes a second source S2 and a second drain D2, which are disposed at respective sides of the first word line WL1. The second source S2 and the second drain D2 of the second switching device T2 are respectively connected to the fourth bit line BL4-1 and a second end of the first magnetic track 100.

Still referring to the example embodiment shown in FIG. 7, a third switching device T3 is disposed at or near a location where the first word line WL1 intersects the fourth bit line BL4-2. The third switching device T3 includes a third source S3 and a third drain D3, which are disposed at respective sides of the first word line WL1. The third source S3 and the third drain D3 of the third switching device T3 are respectively connected to the fourth bit line BL4-2 and a first end of the second magnetic track 120. In this case, the third drain D3 and the second magnetic track 120 are connected via a third conducting wire C3.

A fourth switching device T4 is disposed at or near a location where the first word line WL1 intersects the fourth bit line BL4-3. The fourth switching device T4 includes a fourth source S4 and a fourth drain D4, which are disposed at respective sides of the first word line WL1. The fourth source S4 and the fourth drain D4 of the fourth switching device T4 are respectively connected to the fourth bit line BL4-3 and a second end of the second magnetic track 120. The fourth drain D4 and the second magnetic track 120 are connected via a fourth conducting wire C4.

Still referring to FIG. 7, a first unit 200 may be disposed on a selected region (e.g., a central region or a region adjacent to the central region) of the first magnetic track 100. The second bit line BL2 is disposed above the first unit 200 and the third bit line BL3 is spaced apart from the second bit line BL2 by a given, desired or selected distance.

A fifth switching device T5 is disposed at or near a location where the second word line WL2 intersects the second bit line BL2. The fifth switching device T5 has a fifth source S5 and a fifth drain D5, which are disposed at respective sides of the second word line WL2. The fifth source S5 is electrically connected to a bottom surface of the first unit 200 and the fifth drain D5 is electrically connected to the second bit line BL2. A top surface of the first unit 200 is electrically connected to the third bit line BL3 via a second conducting wire C2. The connection between the top surface of the first unit 200 and the third bit line BL3 and the connection between the bottom surface of the first unit 200 and the fifth source S5 will be described in more detail later with reference to FIG. 8.

The functions of the first to fifth sources S1 to S5 of the first to fifth switching devices T1 to T5 may be respectively switched with those of the first to fifth drains D1 to D5 of the first to fifth switching devices T1 to T5.

Each unit memory region MR1 illustrated in FIG. 7 may correspond to the information storage device of FIG. 1. Although FIG. 7 illustrates that a plurality of the unit memory regions MR1 are arranged in the Y-axis direction, a plurality of the unit memory regions MR1 may be arranged in a matrix in more than one axis direction (e.g., the X-axis and Y-axis directions).

Figure 8:
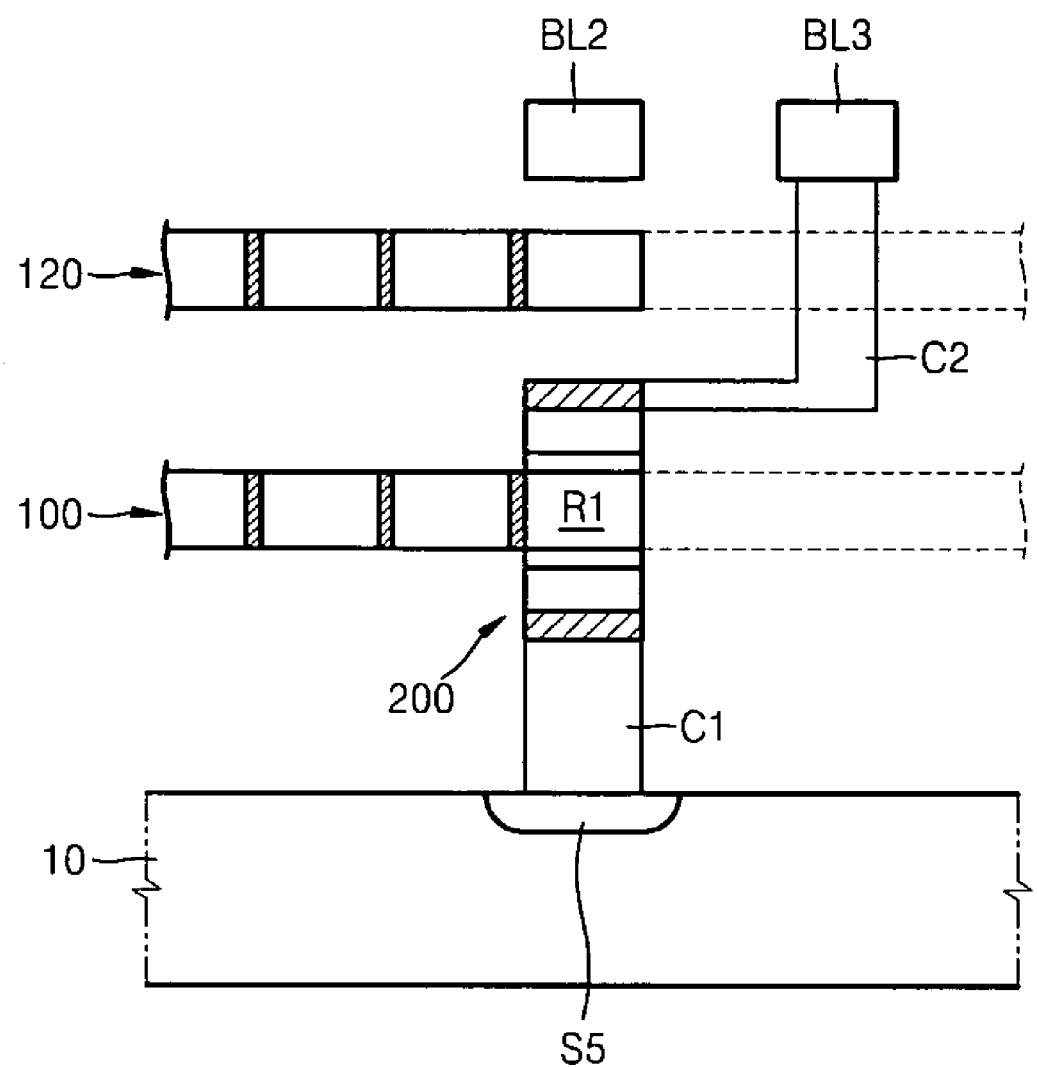
FIG. 8 is a cross-sectional view taken along the line I-I' of FIG. 7.

FIG. 8 is a cross-sectional view taken along the line I-I' of FIG. 7.

Referring to FIG. 8, the bottom surface of the first unit 200 is connected to the fifth source S5 via the first conducting wire C1, and the top surface of the first unit 200 is connected to the third bit line BL3 via the second conducting wire C2.

The structures of the information storage device illustrated in FIGS. 7 and 8 are merely illustrative examples. The layout of the information storage device of FIG. 7 may be changed in various ways, and the structure illustrated in FIG. 8 may also change accordingly.

Figure 9:
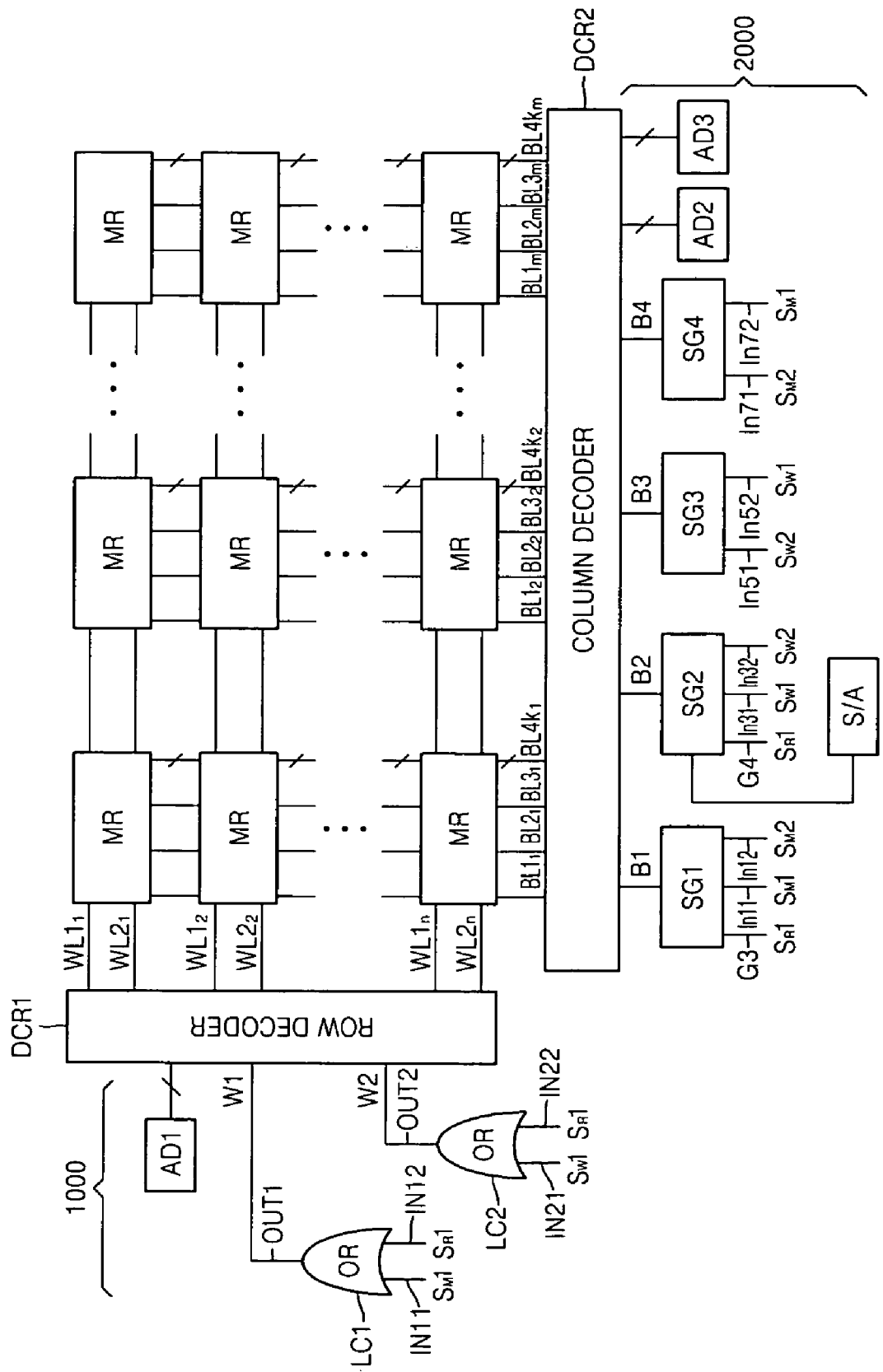
FIG. 9 is a circuit diagram illustrating an example embodiment of an overall architecture of an information storage device.

FIG. 9 is a circuit diagram illustrating an overall architecture of an information storage device according to an example embodiment.

In the example embodiment shown in FIG. 9, a plurality of unit memory regions MR are arranged in a matrix with n rows and m columns. Although FIG. 9 illustrates the unit memory regions MR in a simplified manner, the unit memory regions MR may be constructed as illustrated, for example, in FIG. 1 or 2. In this example embodiment, reference numerals $WL1_i$ b and $WL2_i$ respectively denote a first word line and a second word line that are commonly connected to a plurality of unit memory regions MR in an $i^{th}$ row (where i is a natural number, and $1 \leq i \leq n$). Reference numerals $BL1_j$, $BL2_j$, $BL3_j$ and $BL4k_j$ respectively denote first through fourth bit lines that are commonly connected to a plurality of unit memory regions MR in a $j^{th}$ column (where j is a natural number, and $1 \leq j \leq m$).

The first and second word lines $WL_i$ and $WL2_i$ may respectively correspond to the first and second word lines WL1 and WL2 shown in FIG. 1 or 2. The first to third bit lines $BL1_j$ to $BL3_j$ may respectively correspond to the first to third bit lines BL1 to BL3 of FIGS. 1 and/or 2. The fourth bit line $BL4k_j$ may correspond to the fourth bit lines BL4-1 to BL4-3 in FIG. 1 or 2. More specifically, for example, the fourth bit line $BL4k_j$ may correspond to one of the fourth bit lines BL4-1 to BL4-3.

Still referring to the example embodiment shown in FIG. 9, a row decoder DCR1 is commonly connected to the first and second word lines $WL1_1$ to $WL1_n$ and $WL2_1$ to $WL2_n$. A column decoder DCR2 is commonly connected to the first to fourth bit lines $BL1_1$ to $BL1_m$, $BL2_1$ to $BL2_m$, $BL3_1$ to $BL3_m$, and $BL4k_1$ to $BL4k_m$. A unit memory region MR that is to operate may be selected from among the unit memory regions MR using the row decoder DCR1 and the column decoder DCR2. It would be apparent to those of ordinary skill in the art that the row decoder DCR1 and the column decoder DCR2 may include a selection logic device having a multiplexer (MUX) or demultiplexer (DEMUX) structure. Thus, a detailed description of the row decoder DCR1 and the column decoder DCR2 will not be provided here.

A first peripheral circuit 1000 is arranged adjacent and connected to a side of the row decoder DCR1. The first peripheral circuit 1000 includes at least two logic units (e.g., first and second logic elements LC1 and LC2). In the example embodiment shown in FIG. 9, the first and second logic elements LC1 and LC2 are OR gates. A first row wire W1 is connected between the row decoder DCR1 and an output terminal OUT1 of the first logic element LC1. A second row wire W2 is connected between the row decoder DCR1 and an output terminal OUT2 of the second logic element LC2. The first and second row wires W1 and W2 may be respectively connected to the first and second word lines $WL1_i$ and $WL2_i$.

In FIG. 9, IN11 and IN12 respectively denote first and second input terminals of the first logic element LC1, and IN21 and IN22 respectively denote first and second input terminals of the second logic element LC2. The first peripheral circuit 1000 further includes a row address circuit AD1 connected to the row decoder DCR1. Although not shown in FIG. 9, voltage sources may be respectively connected to the first and second logic elements LC1 and LC2.

Still referring to the example embodiment shown in FIG. 9, a second peripheral circuit 2000 is arranged adjacent and connected to a side of the column decoder DCR2.

As shown in FIG. 9, the second peripheral circuit 2000 includes a plurality of signal generators (e.g., first through fourth signal generators SG1 to SG4) connected to the column decoder DCR2. The first through fourth signal generators SG1 to SG4 may be devices for supplying signals to the first through fourth bit lines $BL1_j$ to $BL4_j$ of the selected unit memory region MR. Example embodiments of the first through fourth signal generators SG1 to SG4 will be described in more detail later.

The first through fourth signal generator SG1 to SG4 are connected to the column decoder DCR2 via first through fourth column wires B1 to B4, respectively. The first through fourth column wires B1 to B4 are further respectively connected to the first through fourth bit lines $BL1_j$ to $BL4k_j$. When the fourth bit line $BL4k_j$ includes three bit lines (e.g., the fourth bit lines BL4-1 to BL4-3 illustrated in FIG. 1 or 2), the fourth column wire B4 may be connected to a bit line selected from among the fourth bit lines BL4-1 to BL4-3.

A sense circuit or sense amplifier S/A is connected to the second signal generator SG2. The sense circuit S/A may be a sense amplifier configured to sense and amplify an information signal read by a selected unit memory region MR. Sense circuits or sense amplifiers such as the sense circuit S/A shown in FIG. 9 are well known in this art and thus a detailed description thereof will not be provided here. The second peripheral circuit 2000 further includes a column address circuit AD2 and a storage branch address circuit AD3 (hereinafter referred to as 'branch address circuit'), which are also connected to the column decoder DCR2.

To select a unit memory region MR that is to operate from among the unit memory regions MR, logic operations of the row decoder DCR1 and the column decoder DCR2 may be controlled by the row address circuit AD1 and the column address circuit AD2, respectively. After selecting the unit memory region MR, information may be written to or read from the selected unit memory region MR, or magnetic domain walls may be moved by using one of the first and second logic elements LC1 and LC2 and at least two signal generators from among the first through fourth signal generators SG1 to SG4. In this case, the fourth bit line $BLK4j$ (e.g., one of BL4-1 to BL4-3 in the case of FIG. 1 or 2) of the selected unit memory region MR may be selected by using the branch address circuit AD3 if necessary, where a signal from the fourth column wire B4 is supplied to the selected fourth bit line $BLK4_j$ (e.g., one of BL4-1 to BL4-3 in the case of FIG. 1 or 2).

Example structures of the first through fourth signal generators SG1 to SG4 of FIG. 9 and a method of operating the same will now be described in detail with reference to FIGS. 10 to 13.

Figure 10:
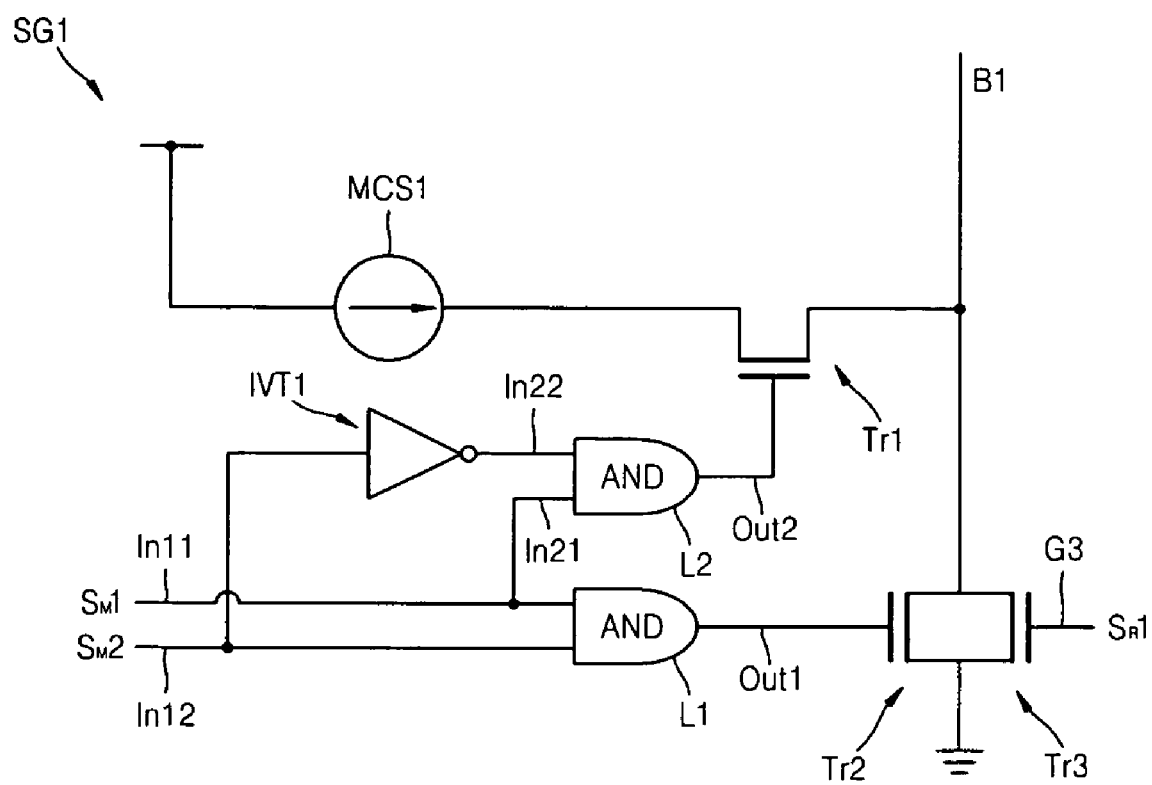
FIGS. 10 to 13 are circuit diagrams respectively illustrating an example embodiment of first to fourth signal generators of FIG. 9.

FIG. 10 is a circuit diagram of an example embodiment of the first signal generator SG1 of FIG. 9.

Referring to FIG. 10, in this example embodiment a moving-current source MCS1 is connected to a first column wire B1. A first transistor Tr1 is connected between the first moving-current source MCS1 and the first column wire B1. A second transistor Tr2 is connected in series between a lower part of the first column wire B1 and ground. The first signal generator SG1 also includes first and second logic gates L1 and L2. The first and second logic elements L1 and L2 may be AND gates. An output terminal Out1 of the first logic element L1 is connected to a gate of the second transistor Tr2, and an output terminal Out2 of the second logic element L2 is connected to a gate of the first transistor Tr1. A first input terminal In21 and a second input terminal In22 of the second logic element L2 are respectively connected to a first input terminal In11 and a second input terminal In12 of the first logic element L1. A first inverter IVT1 for inverting a signal is connected between the second input terminal In22 of the second logic element L2 and the second input terminal In12 of the first logic element L1. First and second moving signals $S_M1$ and $S_M2$ are respectively supplied to the first and second input terminals In11 and In12 of the first logic element L1.

Still referring to FIG. 10, one of the first and second transistors T1 and T2 may be turned on in response to the first and second moving signals $S_M1$ and $S_M2$. If both the first and second moving signals $S_M1$ and $S_M2$ have a value of 1, the second transistor Tr2 may be turned on because information '1' is output from the first logic element L1, but the first transistor Tr1 may not be turned on because information '0' is output from the second logic element L2. In this case, moving current flows from a selected unit memory region to the first column wire B1, then to the second transistor Tr2, and finally to ground. If the first and second moving signals $S_M1$ and $S_M2$ have values of '1' and '0', respectively, the second transistor Tr2 may not be turned on because information '0' is output from the first logic element L1 and the first transistor Tr1 may be turned on because information '1' is output from the second logic element L2. In this case, the moving current flows from the first moving-current source MCS1 to the first transistor Tr1, then to the first column wire B1, and finally, to a selected unit memory region. The movement of magnetic domain walls may occur in association with an operation of a fourth signal generator SG4, which will later be described.

Still referring to FIG. 10, the first signal generator SG1 further includes a third transistor Tr3. The third transistor Tr3 is connected to the first column wire B1 in parallel with the second transistor Tr2 such that the second transistor Tr2 and the third transistor Tr3 share a source and a drain.

In example operation, a read signal $S_R1$ is supplied to a gate terminal G3 of the third transistor Tr3. A read operation related to the third transistor Tr3 may be performed in association with an operation of the second signal generator SG2, which will be described in more detail below.

Figure 11:
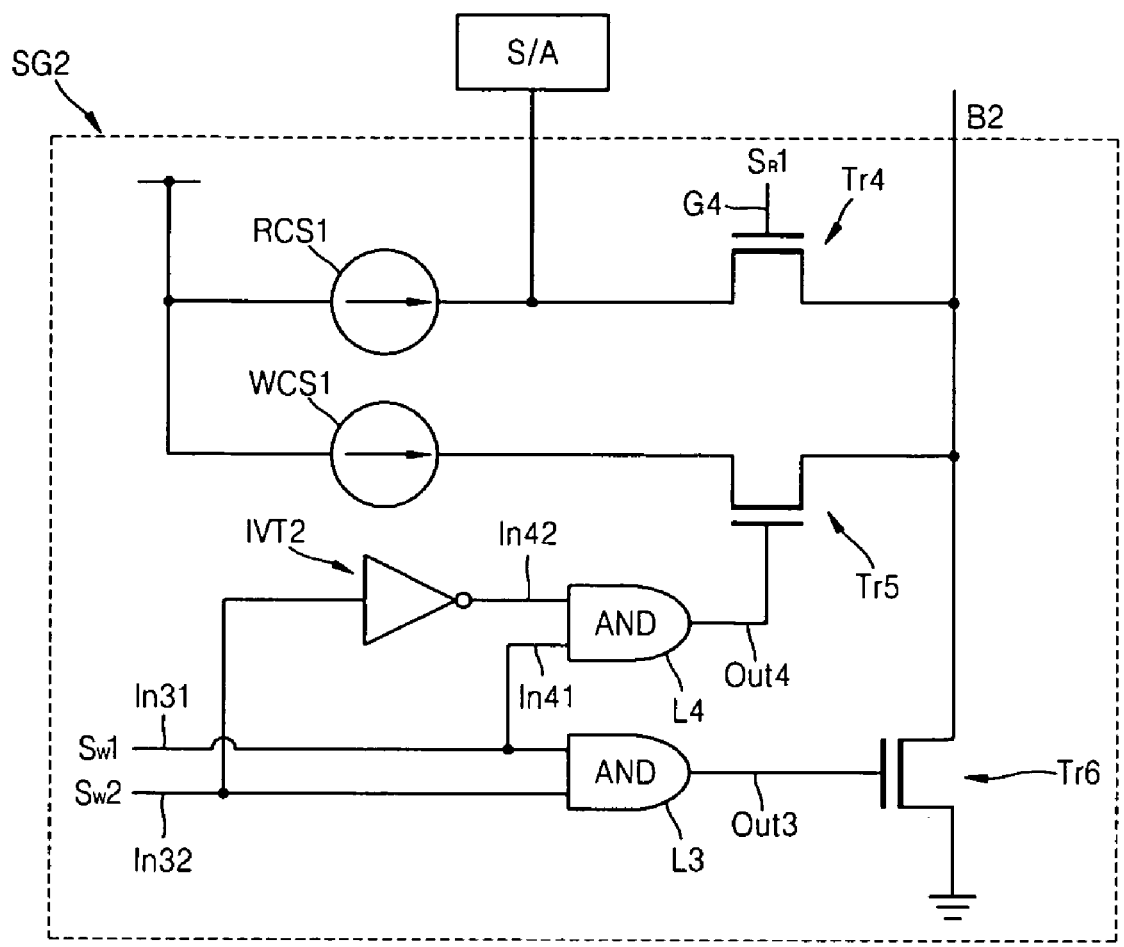

FIG. 11 is a circuit diagram of an example embodiment of the second signal generator SG2 of FIG. 9.

Referring to FIG. 11, in this example embodiment a read current source RCS1 is connected to a second column wire B2. A fourth transistor Tr4 is connected between the read current source RCS1 and the second column wire B2. A sense circuit S/A is connected to a wire connecting the read current source RCS1 and the fourth transistor Tr4.

In example operation, a read signal $S_R1$ is supplied to a gate terminal G4 of the fourth transistor Tr4. If the fourth transistor Tr4 turns on in response to the read signal $S_R1$, read current flows from the read current source RCS1 to a selected unit memory region via the second column wire B2. An information signal read from the selected unit memory region is supplied to the sense circuit S/A. Such a read operation may be performed in association with the operation of the above-described first signal generator SG1. For example, the read signal $S_R1$ may be supplied to the gate terminal G3 of the third transistor Tr3 of FIG. 10 simultaneously when it is supplied to the gate terminal G4 of the fourth transistor Tr4. In this way, the read current supplied to the selected unit memory region via the second column wire B2 of FIG. 11 may flow to ground via the first column wire B1 of FIG. 10. Thus, a read operation may be performed on the selected unit memory region. During the read operation, a sixth transistor Tr6 of FIG. 11, which will be described in more detail later, may be turned off, and thus, the read current may not flow to ground.

Still referring to FIG. 11, the second signal generator SG2 further includes a first write current source WCS1, which is connected to the second column wire B2 in parallel with the read current source RCS1. A fifth transistor Tr5 is connected between the first write current source WCS1 and the second column wire B2. A sixth transistor Tr6 is connected in series between a lower part of the second column wire B2 and ground. The second signal generator SG2 further includes third and fourth logic elements L3 and L4, which are connected to each other. The constructions and connections of the third and fourth logic elements L3 and L4 and the fifth and sixth transistors Tr5 and Tr6 may be similar to those of the first and second logic elements L1 and L2 and first and second transistors Tr1 and Tr2 of FIG. 10. Reference numerals In31, In32 and Out3 respectively denote first and second input terminals and an output terminal of the third logic element L3. Reference numerals In41, In42 and Out4 respectively denote first and second input terminals and an output terminal of the fourth logic element L4. A reference numeral IVT2 denotes a second inverter, which is connected between the second input terminal In32 and the second input terminal In42.

First and second write signals $S_W1$ and $S_W2$ may be supplied to the first and second input terminals In31 and In32 of the third logic element L3. One of the fifth and sixth transistors Tr5 and Tr6 may be turned on in response to the first and second write signals $S_W1$ and $S_W2$. If both the first and second write signals $S_W1$ and $S_W2$ have a value of 1, the sixth transistor Tr6 turns on because information '1' is output from the third logic element L3, but the fifth transistor Tr5 is not turned on because information '0' is output from the fourth logic element L4. In this case, write current flows from a selected unit memory region to the second column wire B2, then to the sixth transistor Tr6, and finally to ground. Thus, first information may be written to a first region R1, such as shown in FIG. 1 or 2, of the selected unit memory region.

If the first and second write signals $S_W1$ and $S_W2$ respectively have values of 1 and 0, the sixth transistor Tr6 is not turned on because information '0' is output from the third logic element L3, but the fifth transistor Tr5 is turned on because information '1' is output from the fourth logic element L4. In this case, the write current flows from the first write current source WCS1 to the fifth transistor Tr5, then to the second column wire B2, and finally to a selected unit memory region. Accordingly, second information may be written to the first region R1 of the unit memory region. Such a write operation may be performed in association with an operation of the third signal generator SG3, which will be described in more detail below.

Figure 12:
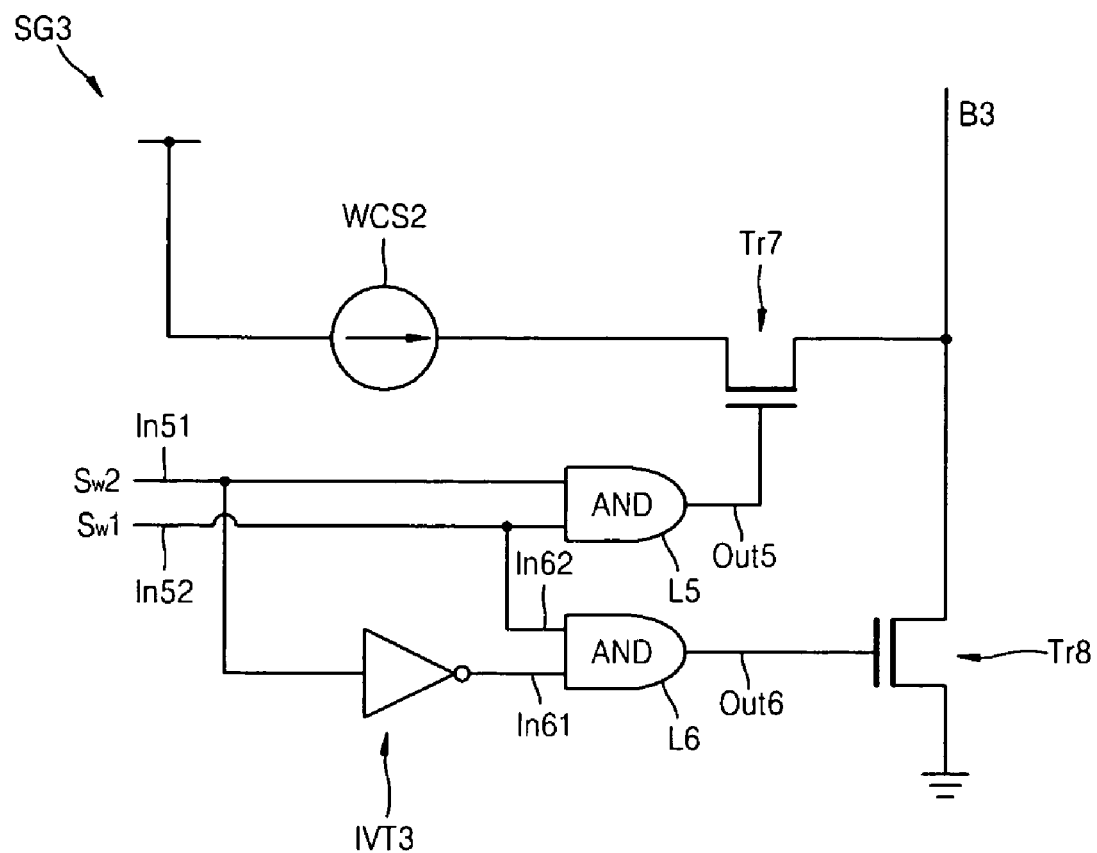

FIG. 12 is a circuit diagram of an example embodiment of the third signal generator SG3 of FIG. 9.

Referring to FIG. 12, a second write current source WCS2 is connected to a third column wire B3. A seventh transistor Tr7 is connected between the second write current source WCS2 and the third column wire B3. An eighth transistor Tr8 is connected in series to a lower part of the third column wire B3. One end of the eighth transistor Tr8 is connected to ground.

The third signal generator SG3 further includes fifth and sixth logic elements L5 and L6, which are connected to each other. In one example, the fifth and sixth logic elements L5 and L6 may be AND gates. An output terminal Out5 of the fifth logic element L5 is connected to a gate of the seventh transistor Tr7, and an output terminal Out6 of the sixth logic element L6 is connected to a gate of the eighth transistor Tr8. A first input terminal In61 of the sixth logic element L6 is connected to a first input terminal In51 of the fifth logic element L5, and a second input terminal In62 of the sixth logic element L6 is connected to a second input terminal In52 of the fifth logic element L5. A third inverter IVT3 is connected between the first input terminal In51 of the fifth logic element L5 and the first input terminal In61 of the sixth logic element L6. First and second write signals Sw1 and Sw2 may be respectively supplied to the second and first input terminals In52 and In51 of the fifth logic element L5.

Referring still to FIG. 12, if both the first and second write signals $S_W1$ and $S_W2$ have a value of 1, the seventh transistor Tr7 turns on, but the eighth transistor Tr8 does not turn on. As a result, the write current flows from the second write current source WCS2 to the seventh transistor Tr7, then the third column wire B3, and finally to a selected unit memory region. If the first write signal $S_W1$ has a value of 1 and the second write signal $S_W2$ has a value of 0, the seventh transistor Tr7 is not turned on, but the eighth transistor Tr8 turns on. As a result, the write current flows from the selected unit memory region to the third column wire B3, then to the eighth transistor Tr8, and finally to ground.

In FIG. 12, the first and second write signals $S_W1$ and $S_W2$ may be respectively equivalent to the first and second write signals $S_W1$ and $S_W2$ of FIG. 11. For example, during a write operation the first and second write signals $S_W1$ and $S_W2$ may be supplied to the third signal generator SG3 of FIG. 12 simultaneously while being supplied to the second signal generator SG2 of FIG. 11. In this case, if both the first and second write signals $S_W1$ and $S_W2$ have a value of 1, the seventh transistor Tr7 of FIG. 12 turns on, the sixth transistor Tr6 of FIG. 11 turns on, and the write current sequentially flows from the second write current source WCS2 to the seventh transistor Tr7, the third column wire B3, a selected unit memory region, the second column wire B2, the sixth transistor Tr6 of FIG. 11, and finally to ground. Thus, first information may be written to a first region R1, such as that of FIG. 1 or 2, of the selected unit memory region.

If the first write signal $S_W1$ has a value of 1 and the second write signal $S_W2$ has a value of 0, the eighth transistor Tr8 of FIG. 12 turns on, the fifth transistor Tr5 of FIG. 11 turns on, and the write current flows from the first write current source WCS1 of FIG. 11 to the fifth transistor Tr5, the second column wire B2, the selected unit memory region, the third column wire B3, the eighth transistor Tr8, and finally to ground. Accordingly, second information may be written to the first region R1 of the selected unit memory region.

Figure 13:
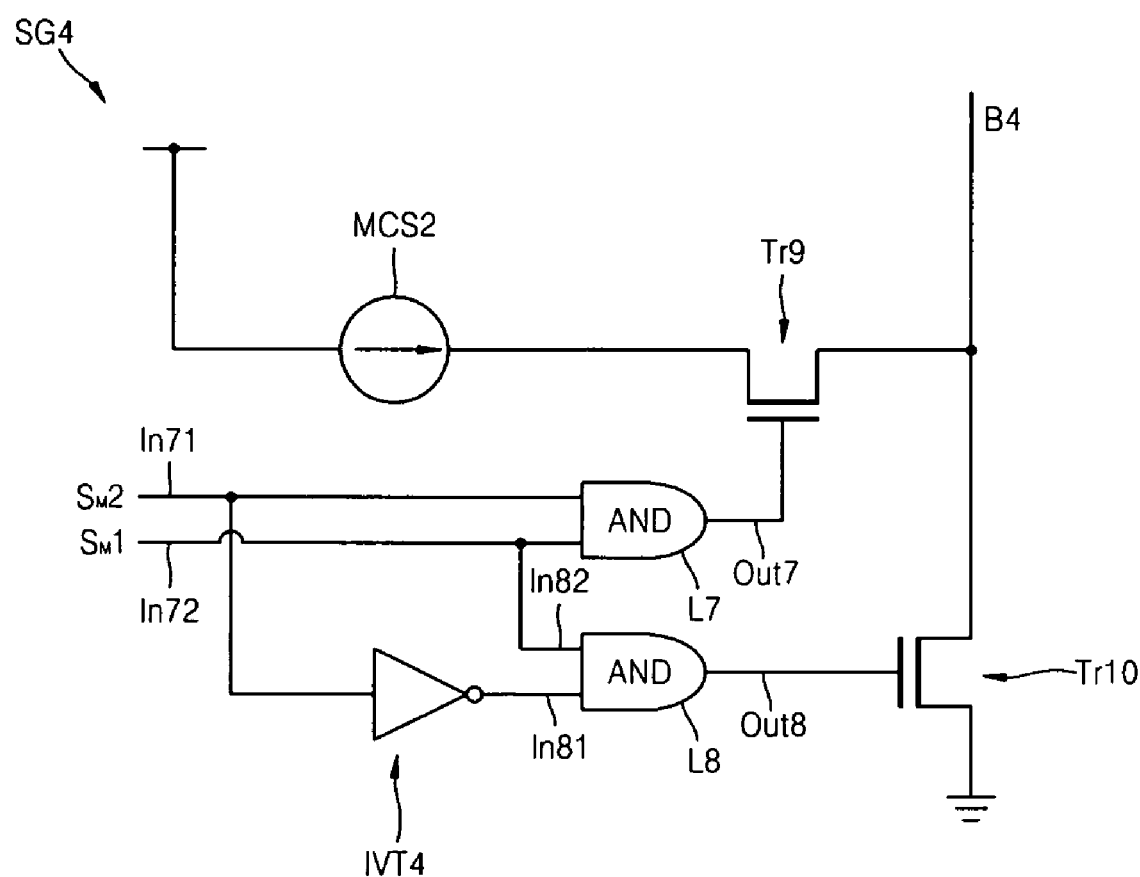

FIG. 13 is a circuit diagram of an example embodiment of the fourth signal generator SG4 of FIG. 9.

Referring to FIG. 13, a second moving-current source MCS2 is connected to a fourth column wire B4. A ninth transistor Tr9 is connected between the second write current source WCS2 and the fourth column wire B4. A tenth transistor Tr10 is connected in series between a lower part of the fourth column wire B4 and ground. The fourth signal generator SG4 further includes seventh and eighth logic elements L7 and L8, which are connected to each other. The constructions and connections of the seventh and eighth logic elements L7 and L8 and the ninth and tenth transistors Tr9 and Tr10 may be similar or substantially similar to those of the fifth and sixth logic elements L5 and L6 and seventh and eighth transistors Tr7 and Tr8 of FIG. 12. Reference numerals In71, In72 and Out7 respectively denote first and second input terminals and an output terminal of the seventh logic element L7. Reference numerals In81, In82 and Out8 respectively denote first and second input terminals and an output terminal of the eighth logic element L8. A reference numeral IVT4 denotes a fourth inverter, which is connected between the first input terminal In71 and the first input terminal In81.

In example operation, first and second moving signals $S_M1$ and $S_M2$ may be respectively supplied to the second and first input terminals In72 and In71 of the seventh logic element L7. If both the first and second moving signals $S_M1$ and $S_M2$ have a value of 1, the ninth transistor Tr9 turns on. As a result, moving current flows from the second moving-current source MCS2 to the ninth transistor Tr9, then to the fourth column wire B4, and finally to a selected unit memory region.

If the first and second moving signals $S_M1$ and $S_M2$ respectively have values of 1 and 0, the tenth transistor Tr10 turns on. As a result, the moving current flows from the selected unit memory region to the fourth column wire B4, then to the tenth transistor Tr10, and finally to ground.

During movement of magnetic domain walls, the fourth signal generator SG4 of FIG. 13 may operate in association with the first signal generator SG1 of FIG. 10. When the ninth transistor Tr9 is turned on, the third transistor Tr3 of FIG. 10 is also turned on, and thus, the moving current flows from the second moving-current source MCS2 to the fourth column wire B4, a selected unit memory region, the first column wire B1 of FIG. 10, the third transistor Tr3, and finally to ground.

Also, when the tenth transistor Tr10 is turned on the first transistor Tr1 of FIG. 10 is turned on, and thus, the moving current flows from the first moving-current source MCS1 of FIG. 10 to the first column wire B1, the selected unit memory region, the fourth column wire B4, the tenth transistor Tr10, and finally to ground. As described above, the fourth column wire B4 may be connected to one of a plurality of fourth bit lines (e.g., the fourth bit lines BL4-1 to BL4-3 of FIG. 1 or 2) of the selected unit memory region. Thus, magnetic domain walls may be moved from one of the first to third storage regions STORAGE1 to STORAGE3 of FIG. 1 or 2 to the buffer region BUFFER of FIG. 1 or 2 and vice versa.

After a desired unit memory region MR is selected using the row decoder DCR1 and the column decoder DCR2 of FIG. 9, a write/read operation may be performed on the selected unit memory region MR or the magnetic domain walls may be moved using the first through fourth signal generators SG1 to SG4. In this case, one of a plurality of fourth bit lines (e.g., the fourth bit lines BL4-1 to BL4-3 in the case of FIG. 1 or 2) of the selected unit memory region, to which a signal is to be supplied, may be selected using the branch address circuit AD3 of FIG. 9 if necessary. The write/ read operation or the movement of the magnetic domain walls may be performed in association with the operation of the first peripheral circuit 1000 of FIG. 9. More specifically, during the write/read operation or the movement of the magnetic domain walls, the first moving signal $S_M1$ and the read signal $S_R1$ may be respectively supplied to the first and second input terminals IN11 and IN12 of the first logic element LC1 of FIG. 9, and the first write signal $S_W1$ and the read signal $S_R1$ may be respectively supplied to the first and second input terminals IN21 and IN22 of the second logic element LC2. If the first logic element LC1 is an OR gate, when at least one of the first moving signal $S_M1$ and the read signal $S_R1$ supplied to the first logic element LC1 has a value of 1, an operation signal may be supplied to the first word line $WL1_i$ connected to the selected unit memory region via the first row wire W1. Thus, the first and second switching devices T1 and T2 of FIG. 1 or 2, which are connected to the first word line $WL1_i$ of the selected unit memory region, may be turned on.

Similarly, if the second logic element LC2 is an OR gate, when at least one of the first write signal $S_W1$ and the read signal $S_R1$ supplied to the second logic element LC2 have values of 1, an operation signal may be supplied to the second word line $WL2_i$ connected to the selected unit memory region via the second row wire W2. Thus, the fifth switching device T5 of FIG. 1 or 2, which is connected to the second word line $WL2_i$ of the selected unit memory region, may turn on. The fifth switching device T5 needs to be turned on in order to write information (see FIG. 4). And, the first switching device T1 and at least one of the second to fourth switching devices T2 to T4 need to be turned on in order to move the magnetic domain walls (see FIG. 5). The first and fifth switching devices T1 and T5 need to be turned on in order to read information (see FIG. 6).

The information storage device of FIG. 9 is constructed to satisfy the above operations. For example, when the first write signal $S_W1$ and the second write signal $S_W2$ respectively supplied to the second signal generator SG2 and the third signal generator SG3 both have a value of 1 to write first information, the first write signal $S_W1$ having a value of 1 is supplied to the first input terminal IN21 of the second logic element LC2. Thus, the fifth switching device T5 connected to the second word line $WL2_i$ connected to the selected unit memory region turns on via the second row wire W2.

When the first write signal $S_W1$ having a value of 1 and the second write signal $S_W2$ having a value of 0 are respectively supplied to the second signal generator SG2 and the third signal generator SG3 to write second information, the first write signal $S_W1$ having a value of 1 is supplied to the first input terminal IN21 of the second logic element LC2. As a result, the fifth switching device T5 connected to the second word line $WL2_i$ connected to the selected unit memory region turns on.

Also, if the read signal $S_R1$ having a value of 1 is supplied to the first and second signal generators SG1 and SG2 to read information, the read signal $S_R1$ having a value of 1 is supplied to the second input terminals IN12 and IN22 of the first and second logic elements LC1 and LC2. Thus, the first to fifth switching devices T1 to T5 connected to the first and second word lines $WL1_i$ and $WL2_i$ connected to the selected unit memory region are turned on via the first and second row wires W1 and W2. Also, to move the magnetic domain walls in a first direction, when the first moving signal $S_M1$ and the second moving signal $S_M2$ having a value of 1 are respectively supplied to the first signal generator SG1 and the fourth signal generator SG4, the first moving signal $S_M1$ having a value of 1 is supplied to the first input terminal IN11 of the first logic element LC1. Thus, the first to fourth switching devices T1 to T4 connected to the first word line WL1$_i$ connected to the selected unit memory region turns on via the first row wire W1. To move the magnetic domain walls in a second direction opposite to the first direction, when the first moving signal S$_M$1 having a value of 1 and the second moving signal S$_M$2 having a value of 0 are respectively supplied to the first signal generator SG1 and the fourth signal generator SG4, the first moving signal S$_M$1 having a value of 1 is supplied to the first input terminal IN11 of the first logic element LC1. Thus, the first to fourth switching devices T1 to T4 connected to the first word line WL1$_i$ connected to the selected unit memory region turn on.

As described above, a write/read operation may be performed on a selected unit memory region by the associated operations of the first and second peripheral circuits 1000 and 2000.

The above example embodiments of write and read operations are as illustrated in FIGS. 14 through 18.

Figure 14:
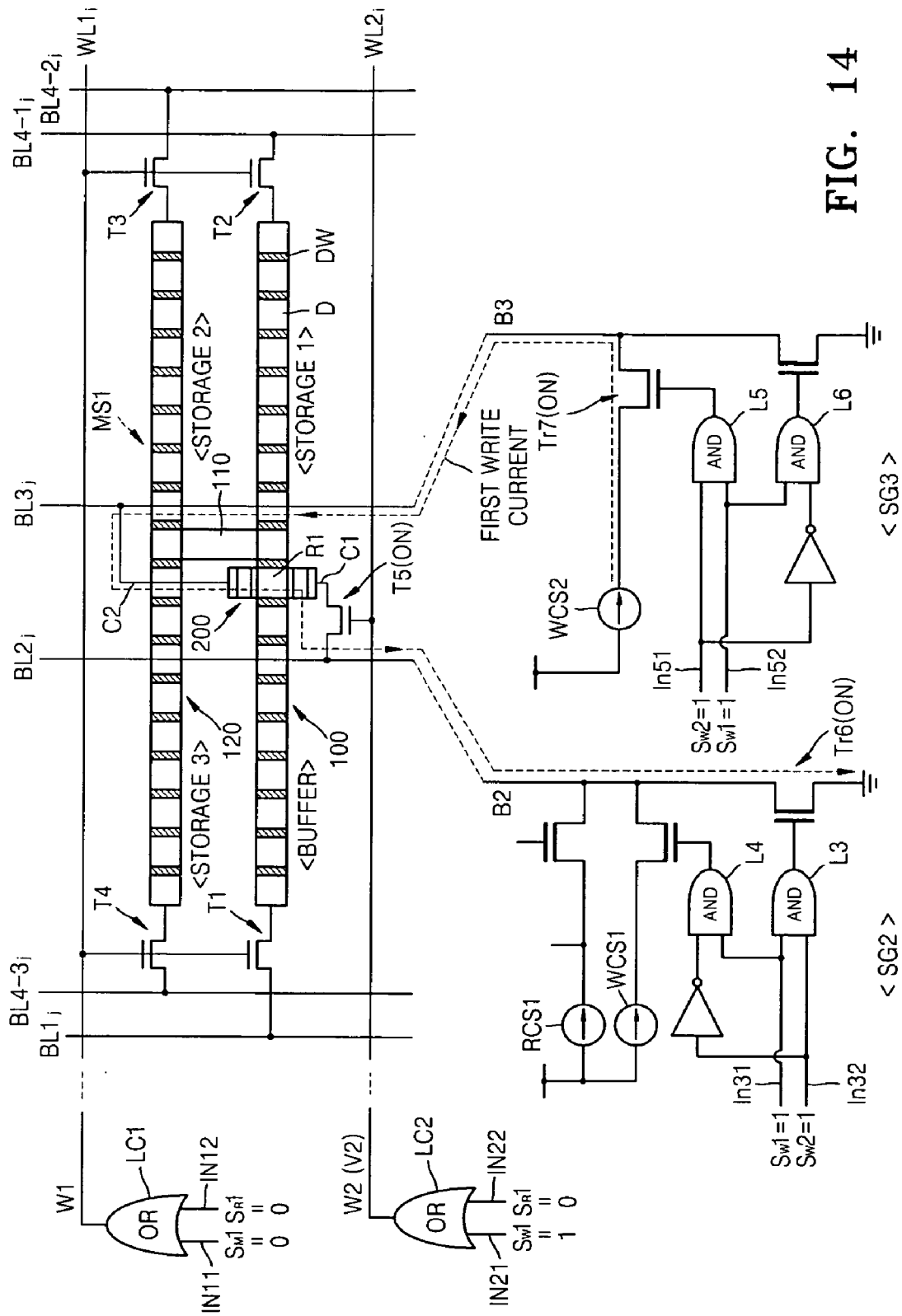
FIGS. 14 to 18 are circuit diagrams illustrating another example embodiment of a method of operating an information storage device.
Figure 15:
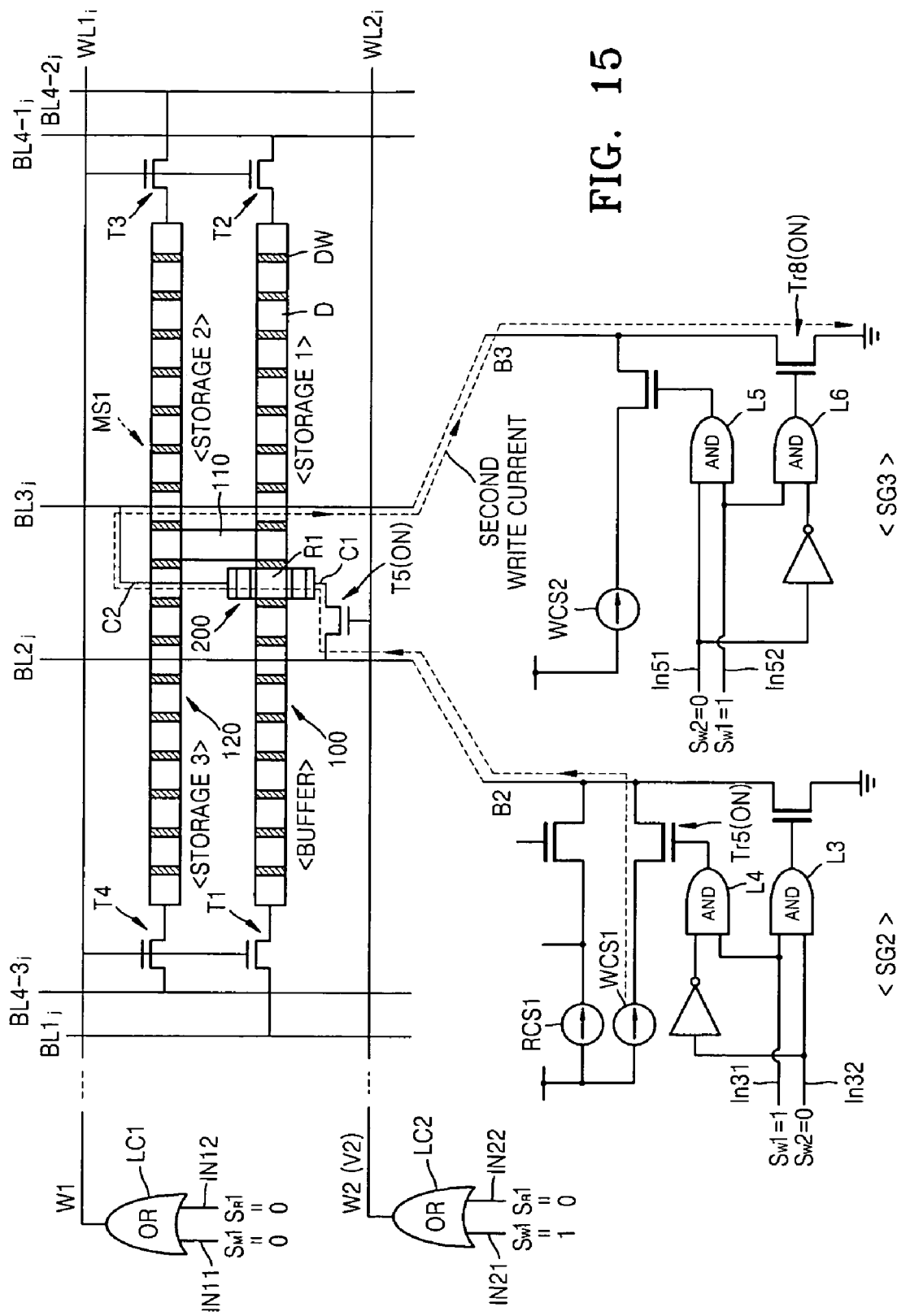
Figure 16:
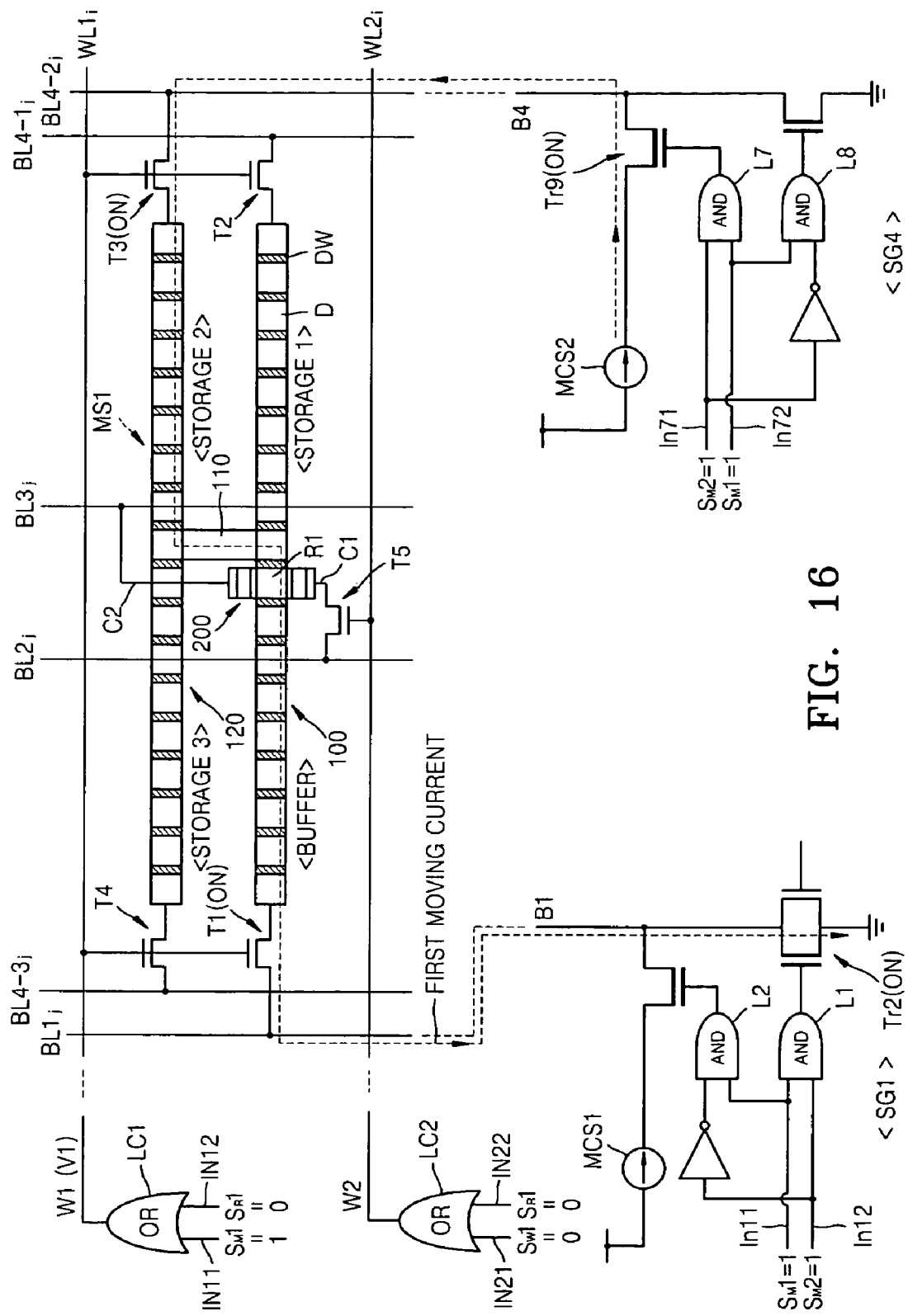
Figure 17:
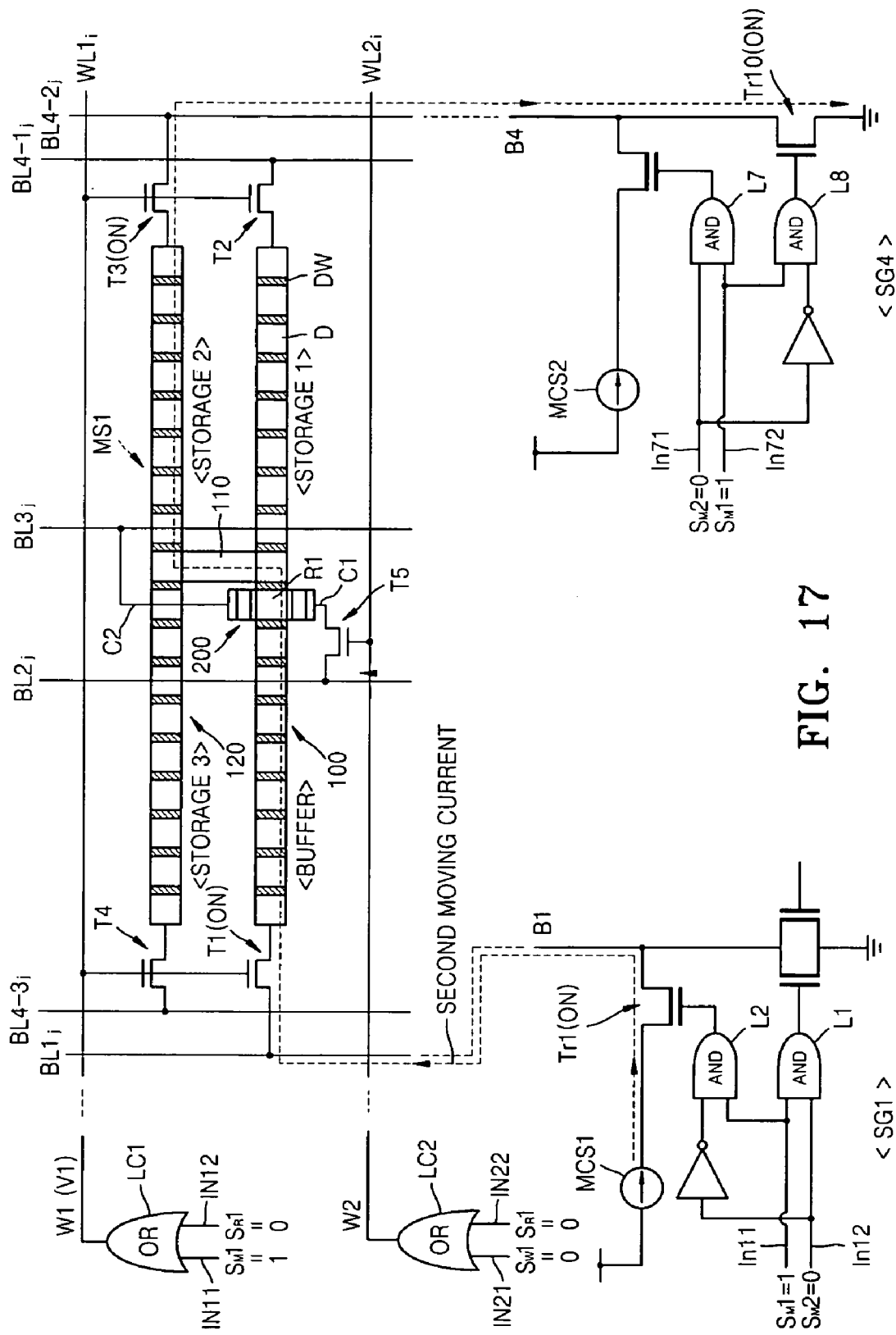
Figure 18:
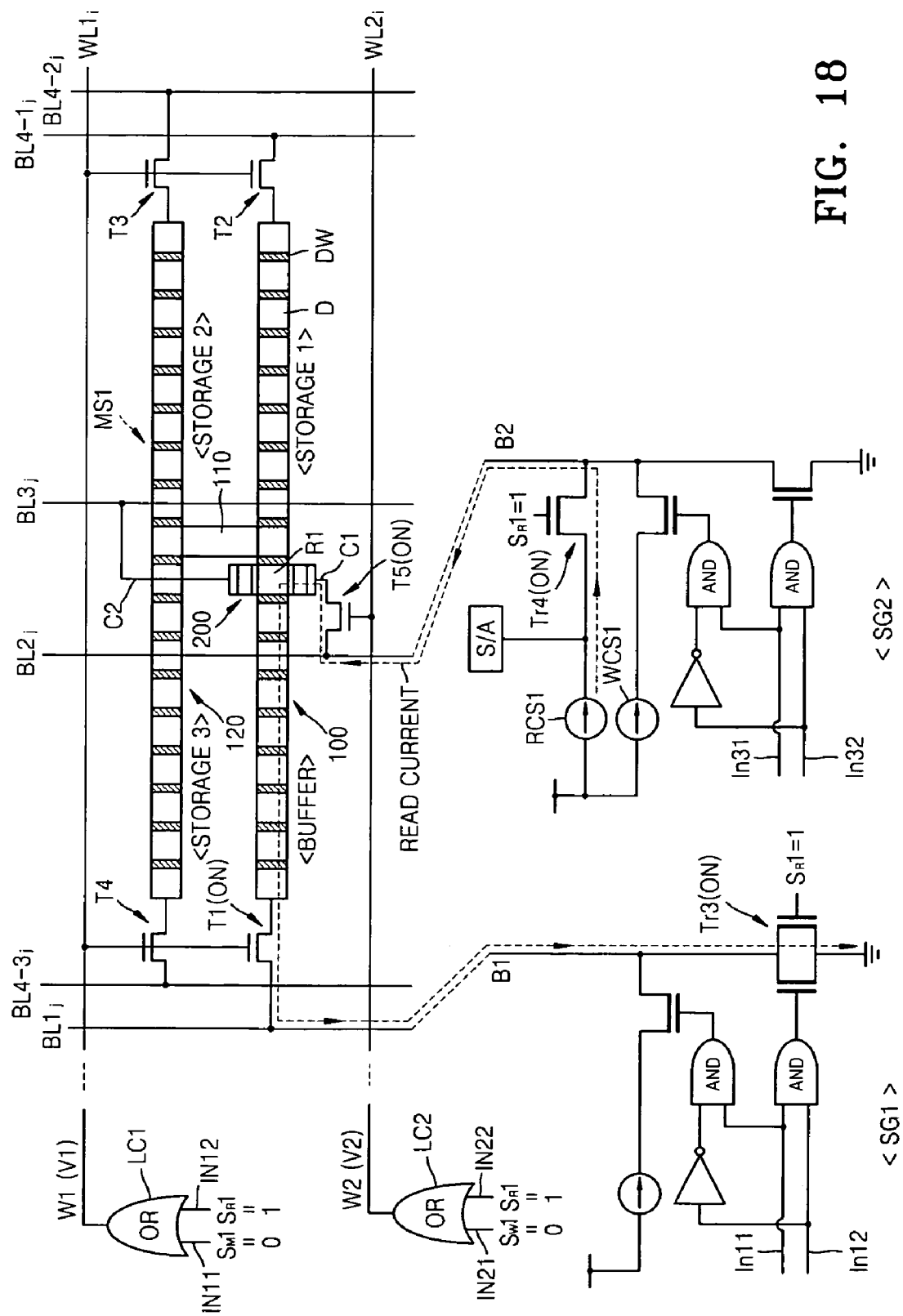

FIGS. 14 and 15 illustrate example embodiments of a write operation. FIGS. 16 and 17 illustrate an example embodiment of movement of magnetic domain walls. FIG. 18 illustrates an example embodiment of a read operation. For convenience of explanation, only elements for performing the write and read operation and the movement of the magnetic domain walls are illustrated in FIGS. 14 through 18.

Referring to FIG. 14, first and second write signals S$_W$1 and S$_W$2 having values of 1 are respectively supplied to second and third signal generators SG2 and SG3. In addition, the first write signal S$_W$1 having a value of 1 supplied to the first input terminal IN21 of the second logic element LC2. In this case, a seventh transistor Tr7 of the third signal generator SG3, a sixth transistor Tr6 of the second signal generator SG2, and a fifth switching device T5 of a selected unit memory region turns on. Thus, first write current flows from a second write current source WCS2 to the seventh transistor Tr7, a third column wire B3, the selected unit memory region, the second column wire B2, the sixth transistor Tr6, and finally to ground. Thus, first information is written to a first region R1 of the selected unit memory region. The principle of writing the first information may be performed as described above with reference to FIG. 3A.

Referring to FIG. 15, a first write signal S$_W$1 having a value of 1 and a second write signal S$_W$2 having a value of 0 are respectively supplied to the second signal generator SG2 and the third signal generator SG3. In addition, the first write signal S$_W$1 having a value of 1 is supplied to a first input terminal IN21 of a second logic element LC2. In this case, a fifth transistor Tr5 of the second signal generator SG2, an eighth transistor Tr8 of the third signal generator SG3, and a third switching device T3 of a selected unit memory region turns on. Thus, second write current flows from a first write current source WCS1 to the fifth transistor Tr5, a second column wire B2, the selected unit memory region, a third column wire B3, the eighth transistor Tr8, and finally to ground. Thus, second information is written to a first region R1 of the selected unit memory region. The principle of writing the second information may be performed as described above with reference to FIG. 3B.

Referring to FIG. 16, first and second moving signals S$_M$1 and S$_M$2 having values of 1 are respectively supplied to first and fourth signal generators SG1 and SG4. In addition, the first moving signal S$_M$1 having the value of 1 is supplied to the first input terminal IN11 of the first logic element LC1. In this case, a ninth transistor Tr9 of the fourth signal generator SG4, a second transistor Tr2 of the first signal generator SG1, and first to fourth switching devices T1 to T4 of a selected unit memory region turn on. Also, one of a plurality of fourth bit lines BL4-1$_j$ to BL4-3$_j$ (e.g., the fourth bit line BL4-2$_j$) is selected, and a signal is received from a fourth column wire B4 via the fourth bit line BL4-2$_j$. Thus, first moving current flows from a second moving-current source MCS2 to the ninth transistor Tr9, the fourth column wire B4, a second storage region STORAGE2 and a buffer region BUFFER of the selected unit memory region, the first column wire B1, the second transistor Tr2, and finally to ground. Accordingly, magnetic domain walls of the selected unit memory region move from the buffer region BUFFER to the second storage region STORAGE2.

Referring to FIG. 17, a first moving signal S$_M$1 having a value of 1 and a second moving signal S$_M$2 having a value of 0 are respectively supplied to a first signal generator SG1 and a fourth signal generator SG4. In addition, the first moving signal S$_M$1 having the value of 1 is supplied to a first input terminal IN11 of a first logic element LC1. In this case, a first transistor Tr1 of the first signal generator SG1, a tenth transistor Tr10 of the fourth signal generator SG4, and first to fourth switching devices T1 to T4 of a selected unit memory region turn on. Also, one of a plurality of fourth bit lines BL4-1$_j$ to BL4-3$_j$ (e.g., the fourth bit line BL4-2$_j$) is selected, and a signal is received from a fourth column wire B4 via the fourth bit line BL4-2$_j$. Thus, second moving current flows from a first moving-current source MCS1 to the first transistor Tr1, a first column wire B1, a buffer region BUFFER and a second storage region Storage 2 of the selected unit memory region, the fourth column wire B4, the tenth transistor Tr10, and finally to ground. Accordingly, magnetic domain walls of the first magnetic track 100 move from the second storage region STORAGE2 to the buffer region BUFFER.

Referring to FIG. 18, a read signal S$_R$1 having a value of 1 is supplied to first and second signal generators SG1 and SG2, and the read signal S$_R$1 having the value of 1 is supplied to first and second logic elements LC1 and LC2. In this case, a fourth transistor Tr4 of the second signal generator SG2, a third transistor Tr3 of the first signal generator SG1, and first to fifth switching devices T1 to T5 of a selected unit memory region turn on. Thus, read current flows from a moving-current source RCS1 to a second column wire B2, a first unit 200 of the selected unit memory region, a first column wire B1, the third transistor Tr3, and finally to ground.

Figure 19:
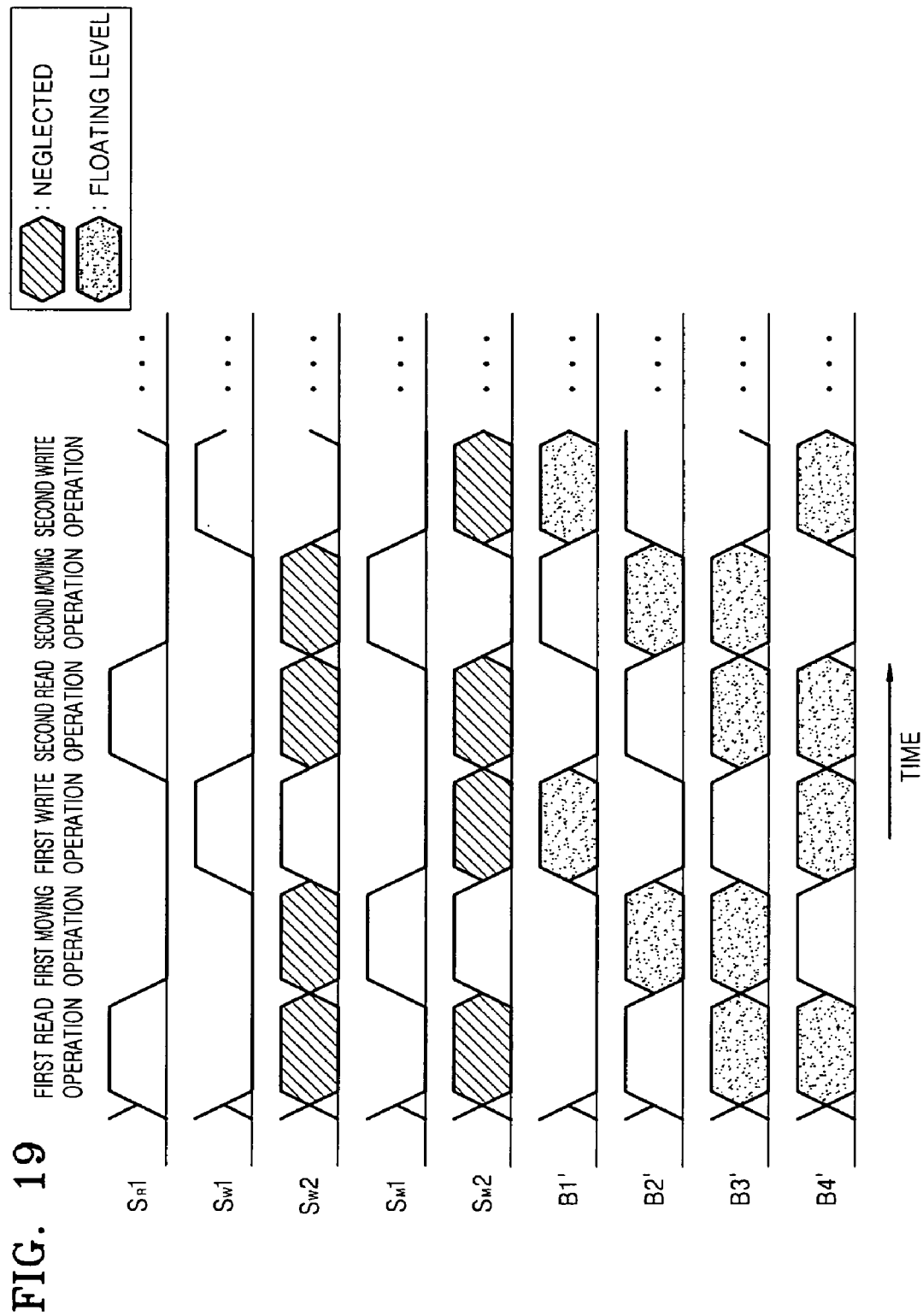
FIG. 19 is a timing diagram of various input signals that may be used when operating an example embodiment of an information storage device.

FIG. 19 is a timing diagram of various input signals S$_R$1, S$_W$1, S$_W$2, S$_M$1, and S$_M$2 that may be used when operating information storage devices according to example embodiments. FIG. 19 is also a timing diagram of first through fourth current signals B1' to B4', which may flow through the first through fourth column wires B1 to B4 of FIG. 9, respectively. In FIG. 19, slanted patterns denote signals that may be neglected, and dot patterns denote floating-level signals. These signals of FIG. 19 will now be described with reference to FIGS. 14 through 18.

Referring to FIG. 19, in a first read operation, the read signal S$_R$1 having a value of 1 may be supplied to the information storage device. Thus, the current signal B2' corresponding to '1' and the current signal B1' corresponding to '0' may be respectively supplied to a second column wire B2 and a first column wire B1. As a result, read current may flow from the second column wire B2 to the first column wire B1 as illustrated in FIG. 18.

In first movement of magnetic domain walls, the first and second moving signals S$_M$1 and S$_M$2 having a value of 1 may be supplied to the information storage device, and thus, the current signal B1' corresponding to '0' and the current signal B4' corresponding to '1' may be respectively supplied to the first column wire B1 and the fourth column wire B4. As a result, a first moving current may flow from the fourth column wire B4 to the first column wire B1 as illustrated in FIG. 16.

In a first write operation, the first and second write signals $S_W1$ and $S_W2$ having a value of 1 may be supplied to the information storage device, and thus, the current signal B2' corresponding to '0' and the current signal B3' corresponding to '1' may be respectively supplied to the second column wire B2 and the third column wire B3. As a result, a first write current may flow from the third column wire B3 to the second column wire B2 as illustrated in FIG. 14.

A second read operation may be performed in a manner similar or substantially similar to the first read operation.

In a second movement of the magnetic domain walls, the first and second moving signals $S_M1$ and $S_M2$ respectively having a value of 1 and a value of 0 may be supplied to the information storage device. Thus, the current signal B1' corresponding to '1' and the current signal B4' corresponding to '0' may be respectively supplied to the first column wire B1 and the fourth column wire B4. As a result, a second moving current may flow from the first column wire B1 to the fourth column wire B4 as illustrated in FIG. 17.

In a second write operation, the first and second write signals $S_W1$ and $S_W2$ respectively having a value of 1 and a value of 0 may be supplied to the information storage device. Thus, the current signal B2' corresponding to '1' and the current signal B3' corresponding to '0' may be respectively supplied to the second column wire B2 and the third column wire B3. As a result, a second write current may flow from the second column wire B2 to the third column wire B3 as illustrated in FIG. 15. The signals of FIG. 19 are just illustrative examples and may be changed in various ways.

Figure 20:
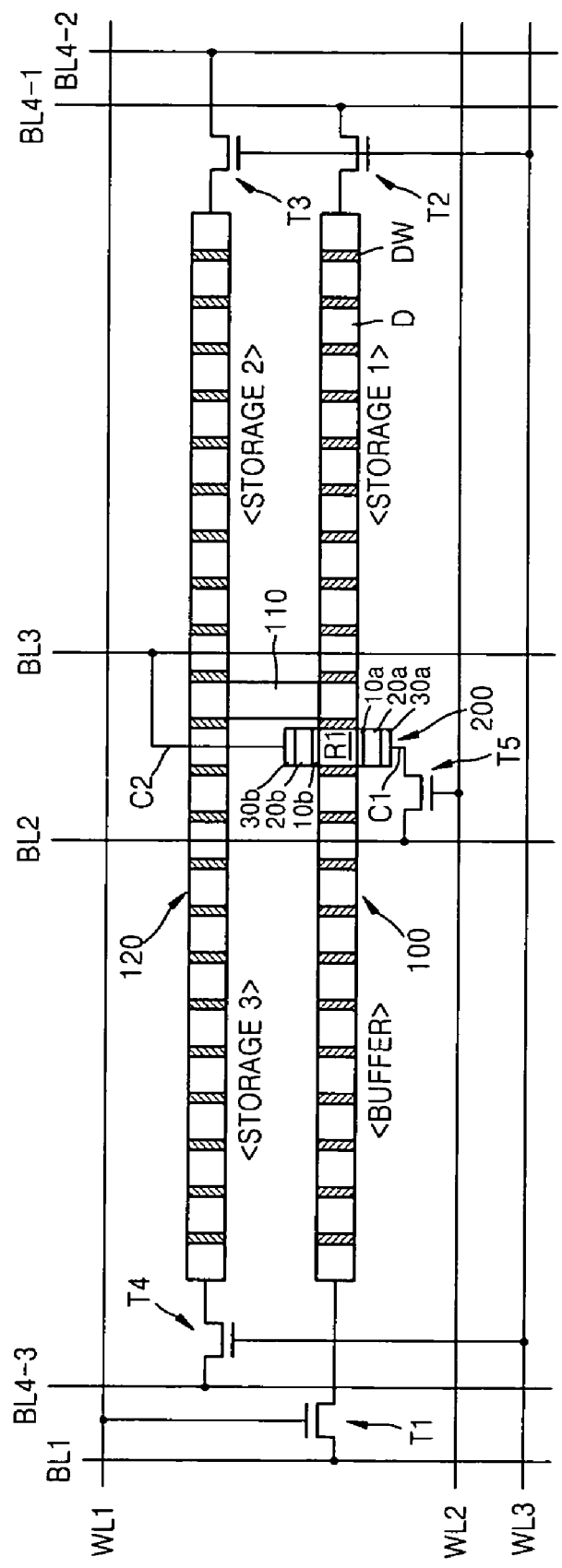
FIGS. 20 and 21 are circuit diagrams of other example embodiments of an information storage device.
Figure 21:
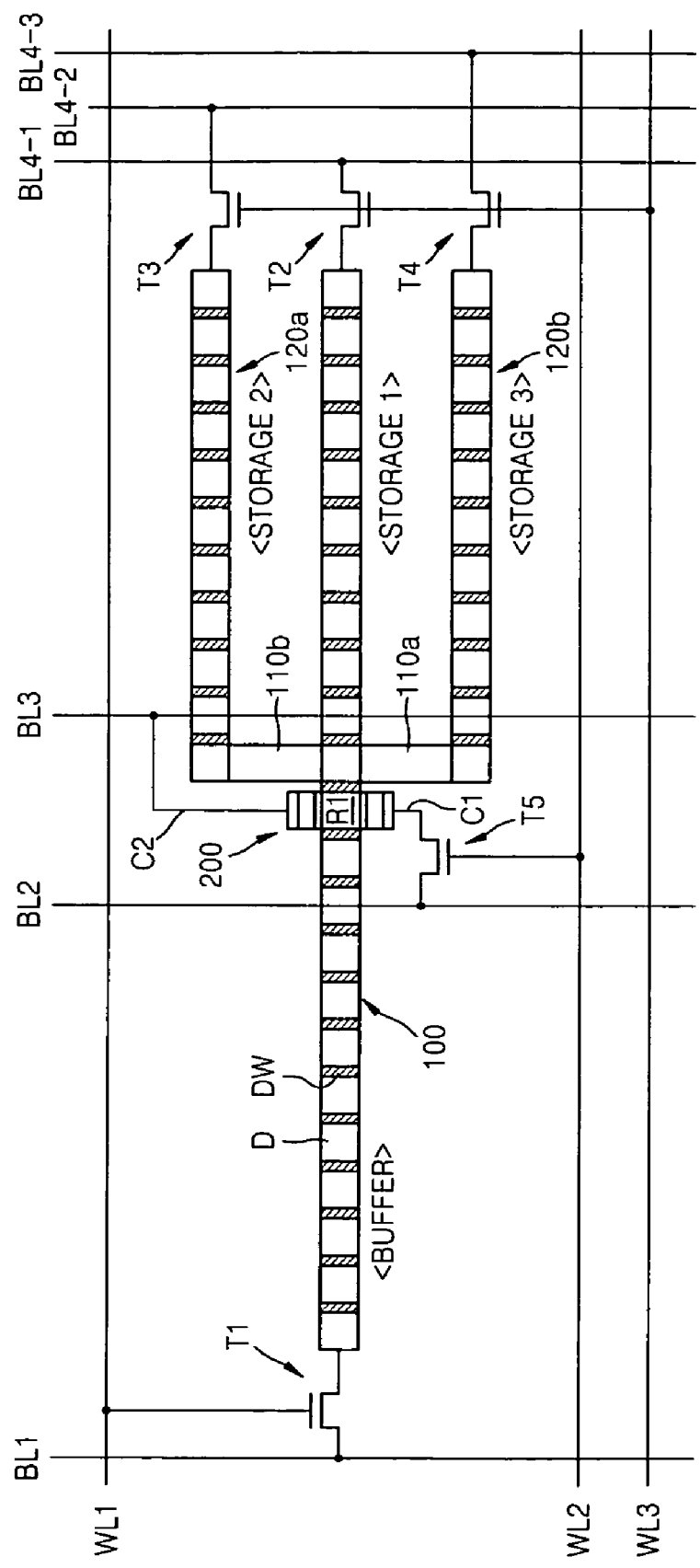

The above-described information storage devices may be constructed in various ways. For example, although FIGS. 1 and 2 illustrate that the first to fourth switching devices T1 to T4 are commonly connected to the first word line WL1, the first to fourth switching devices T1 to T4 may be divided and connected to at least two word lines in other example embodiments as illustrated in FIGS. 20 and 21. The information storage devices illustrated in FIG. 20 and FIG. 21 are respectively modified examples of those illustrated in FIGS. 1 and 2.

Referring to FIGS. 20 and 21, a first switching device T1 may be connected to a first word line WL1, a fifth switching device T5 may be connected to a second word line WL2, and second to fourth switching devices T2 to T4 may be connected to a third word line WL3. As the construction of a unit memory region in FIGS. 20 and 21 is different than as illustrated in FIGS. 1 and 2, those of the first and second peripheral circuits 1000 and 2000 illustrated in FIGS. 9 and 10 through 13 may also be changed and operate differently accordingly.

If at least one second magnetic track 120, or 120a and 120b are connected to a first track 100 to share one buffer region BUFFER by a plurality of storage regions STORAGE1 to STORAGE3 as illustrated in FIGS. 1, 2, 20 and 21, then a rate of the buffer region BUFFER that occupies in a magnetic structure MS1 or MS2 may be reduced, thereby increasing the storage capacity and/or integration of the information storage device. Also, when a magnetic structure is manufactured by stacking a plurality of magnetic tracks, integration of the information storage device may be increased more easily by increasing the total number of magnetic tracks to be stacked. For example, when the first to fourth switching devices T1 to T4 are commonly connected to the first word line WL1 as illustrated in FIG. 1 or 2, the integration of the information storage device may be improved (e.g., greatly improved).

It should be understood that the example embodiments described therein should be considered in a descriptive sense only and not for purposes of limitation. For example, it would be obvious to those of ordinary skill in the art that in FIGS. 1, 2, 20 and 21, a plurality of magnetic tracks may be arranged to be apart from one another in a Y-axis rather than a Z-axis and may be connected in various ways. The structure and elements of the first unit 200 may be changed in various ways. Further, the constructions of the first and second peripheral circuits 1000 and 200 illustrated in FIGS. 9 and 13 may be constructed in various ways. Accordingly, the spirit and scope of this disclosure should be defined by the claims.

What is claimed is:

1. An information storage device comprising:
   a magnetic structure including a buffer track and a plurality of storage tracks connected to the buffer track, each of the buffer track and the plurality of storage tracks including a plurality of magnetic domains and magnetic domain walls between adjacent magnetic domains;
   a write/read unit disposed on the magnetic structure;
   a plurality of switching devices respectively connected to the buffer track, the plurality of storage tracks, and a first end of the write/read unit; and
   a circuit configured to control the plurality of switching devices and further configured to supply current to at least one of the magnetic structure and the write/read unit.

2. The device of claim 1, wherein the plurality of storage tracks are connected to an end of the buffer track, and wherein the plurality of storage tracks are connected in parallel.

3. The device of claim 1, wherein the write/read unit is disposed at one of the end of the buffer track and a region adjacent to the end of the buffer track.

4. The device of claim 1, wherein the magnetic structure comprises:
   a first magnetic track; and
   at least one second magnetic track connected to the first magnetic track; wherein
      a first portion of the first magnetic track corresponds to the buffer track, and
      a second portion of the first magnetic track and the at least one second magnetic track correspond to the plurality of storage tracks.

5. The device of claim 4, wherein a length of the at least one second magnetic track is the same as a length of the first magnetic track, and wherein
   one of a central region and a region adjacent to the central region of the at least one second magnetic track is connected to one of a central region and a region adjacent to the central region of the first magnetic track, and
   each of the at least one second magnetic tracks corresponds to two of the plurality of storage tracks.

6. The device of claim 4, wherein a length of the at least one second magnetic track is the same as a length of the buffer track, and wherein
   an end of the at least one second magnetic track is connected to one of a central region and a region adjacent to the central region of the first magnetic track, and
   each of the at least one second magnetic tracks corresponds to one of the plurality of storage tracks.

7. The device of claim 1, wherein the plurality of switching devices are transistors.

8. The device of claim 7, wherein ones of the plurality of switching devices connected to the buffer track and the plurality of storage tracks are further connected to a first word line, and wherein a switching device, among the plurality of switching devices, connected to the write/read unit is further connected to a second word line.

9. The device of claim 8, wherein a plurality of bit lines intersect the first and second word lines, and wherein the plurality of bit lines are respectively connected to the plurality of switching devices and a second end of the write/read unit.

10. The device of claim 9, wherein the circuit comprises:
a first circuit unit connected to the first and second word lines; and
a second circuit unit connected to the plurality of bit lines.

11. The device of claim 10, wherein the second circuit unit comprises:
a first signal generator configured to supply a signal to a bit line, among the plurality of bit lines, that is connected to a switching device, which is further connected to the buffer track;
a second signal generator configured to supply a signal to a bit line, among the plurality of bit lines, that is connected to a switching device, which is further connected to the first end of the write/read unit;
a third signal generator configured to supply a signal to a bit line, among the plurality of bit lines, that is connected to the second end of the write/read unit; and
a fourth signal generator configured to supply a signal to bit lines, among the plurality of bit lines, that are connected to switching devices, which are further connected to the plurality of storage tracks.

12. The device of claim 11, wherein the second circuit unit comprises:
a selection circuit configured to select a bit line to which a signal is supplied from the fourth signal generator, the selected bit line being selected from among bit lines connected to the switching devices, which are further connected to the plurality of storage tracks.

13. The device of claim 11, wherein,
the first and second signal generators are configured to control a read operation performed on a first region of the magnetic structure on which the write/read unit is disposed,
the second and third signal generators are configured to control a write operation performed on the first region, and
the first and fourth signal generators are configured to control movement of magnetic domain walls in the magnetic structure.

14. The device of claim 13, wherein the first circuit unit is configured to activate the first and second word lines for the read operation, configured to activate the second word line for the write operation, and configured to activate the first word line for moving the magnetic domain walls.

15. The device of claim 14, wherein the first circuit unit comprises:
a first logic gate having an output terminal connected to the first word line; and
a second logic gate having an output terminal connected to the second word line; wherein
a moving signal and a read signal are respectively supplied to first and second input terminals of the first logic gate, and a write signal and the read signal are respectively supplied to first and second input terminals of the second logic gate.

16. The device of claim 13, wherein the first signal generator comprises:
a first interconnecting wire connected to a bit line, among the plurality of bit lines, corresponding to the switching device, which is connected to the buffer track;
a first moving-current source connected to the first interconnecting wire;
a first transistor connected between the first moving-current source and the first interconnecting wire;
second and third transistors connected in parallel between the first interconnecting wire and a ground potential;
a first logic gate having first and second input terminals, and an output terminal, the output terminal of the first logic gate being connected to the second transistor;
a second logic gate having first and second input terminals, and an output terminal, the output terminal of the second logic gate being connected to the first transistor, and the first and second input terminals being respectively connected to the first and second input terminals of the first logic gate; and
a first inverter connected between the second input terminals of the first and second logic gates; wherein
moving signals for moving the magnetic domain walls are supplied to the first and second input terminals of the first logic gate, and a read signal is supplied to a gate terminal of the third transistor.

17. The device of claim 13, wherein the second signal generator comprises:
a second interconnecting wire connected to a bit line, among the plurality of bit lines, corresponding to the switching device, which is connected to the write/read unit;
a read current source and a first write current source connected in parallel with the second interconnecting wire;
a fourth transistor connected between the read current source and the second interconnecting wire;
a fifth transistor connected between the first write current source and the second interconnecting wire;
a sixth transistor connected between the second interconnecting wire and a ground potential;
a third logic gate having first and second input terminals, and an output terminal, the output terminal of the third logic gate being connected to the sixth transistor;
a fourth logic gate having first and second input terminals, and an output terminal, the output terminal of the fourth logic gate being connected to the fifth transistor and the first and second input terminals being respectively connected to the first and second input terminals of the third logic gate; and
a second inverter connected between the second input terminals of the third and fourth logic gates; wherein
write signals are supplied to the first and second input terminals of the third logic gate and a read signal is supplied to a gate terminal of the fourth transistor.

18. The device of claim 13, wherein the third signal generator comprises:
a third interconnecting wire connected to a bit line, among the plurality of bit lines, which is connected to the second end of the write/read unit;
a second write current source connected to the third interconnecting wire;
a seventh transistor connected between the second write current source and the third interconnecting wire;
an eighth transistor connected between the third interconnecting wire and a ground potential;
a fifth logic gate having first and second input terminals, and an output terminal, the output terminal of the fifth logic gate being connected to the seventh transistor;
a sixth logic gate having first and second input terminals, and an output terminal, the output terminal of the sixth logic gate being connected to the eighth transistor and the first and second input terminals being respectively connected to the first and second input terminals of the fifth logic gate; and a third inverter connected between the first input terminals of the fifth and sixth logic gates; wherein
write signals are supplied to the first and second input terminals of the fifth logic gate.

19. The device of claim 13, wherein the fourth signal generator comprises:
a fourth interconnecting wire connected to bit lines, among the plurality of bit lines, corresponding to switching devices connected to the storage tracks;
a second moving-current source connected to the fourth interconnecting wire;
a ninth transistor connected between the second moving-current source and the fourth interconnecting wire;
a tenth transistor connected between the fourth interconnecting wire and a ground potential;
a seventh logic gate having first and second input terminals, and an output terminal, the output terminal of the seventh logic gate being connected to the ninth transistor;
an eighth logic gate having first and second input terminals, and an output terminal, the output terminal of the eighth logic gate being connected to the tenth transistor and the first and second input terminals being respectively connected to the first and second input terminals of the seventh logic gate; and
a fourth inverter connected between the first input terminals of the seventh and eighth logic gates; wherein
moving signals for moving the magnetic domain walls are supplied to the first and second input terminals of the seventh logic gate.

20. The device of claim 10, wherein the magnetic structure, the first and second word lines, the plurality of bit lines and the plurality of switching devices form a unit memory region, and a plurality of unit memory regions form a memory array.

21. The device of claim 20, wherein a first decoder is connected between the first circuit unit and the memory array, and a second decoder is connected between the second circuit unit and the memory array.

22. The device of claim 1, wherein a first of the plurality of switching devices connected to the buffer track is further connected to a first word line, a second of the plurality of switching devices connected to the write/read unit is further connected to a second word line, and the plurality of switching devices connected to the plurality of storage tracks are further connected to a third word line.

23. A method of operating the information storage device of claim 1, the method comprising:
activating at least one of the plurality of switching devices; and
supplying current to at least one of the magnetic structure and the write/read unit.

24. The method of claim 23, wherein the supplied current is one of a read current, write current, and moving current for moving the magnetic domain walls of the magnetic structure.

25. The method of claim 24, wherein the moving current is supplied between the buffer track and one of the storage tracks.

26. The method of claim 23, wherein switching devices connected to the buffer track and the plurality of storage tracks are further connected to a first word line, a switching device connected to the first end of the write/read unit is further connected to a second word line, and a plurality of bit lines are arranged to intersect the first and second word lines, wherein the plurality of bit lines are connected to the switching devices and a second end of the write/read unit, respectively.

27. The method of claim 26, wherein the circuit comprises:
a first circuit unit connected to the first and second word lines; and
a second circuit unit connected to the plurality of bit lines.

28. The method of claim 27, wherein the second circuit unit comprises:
a first signal generator configured to supply a signal to a bit line, among the plurality of bit lines, connected to the buffer track;
a second signal generator configured to supply a signal to a bit line, among the plurality of bit lines, connected to a switching device, which is further connected to the first end of the write/read unit;
a third signal generator configured to supply a signal to a bit line, among the plurality of bit lines, connected to the second end of the write/read unit; and
a fourth signal generator configured to supply a signal to a bit line selected from among the plurality of bit lines connected to switching devices, which are further connected to the plurality of storage tracks; wherein
the first and second signal generators are configured to control a read operation performed on a first region of the magnetic structure on which the write/read unit is disposed,
the second and third signal generators are configured to control a write operation performed on the first region, and
the first and fourth signal generators are configured to control movement of magnetic domain walls of the magnetic structure.

29. The method of claim 28, wherein the first circuit unit is configured to activate the first and second word lines, and the second circuit unit is configured to control a read current supplied to the first signal generator from the second signal generator via the write/read unit.

30. The method of claim 28, wherein the first circuit unit is configured to activate the second word line, and the second circuit unit is configured to control a write current supplied from one of the second and third signal generators to an other of the second and third signal generators via the write/read unit.

31. The method of claim 28, wherein the first circuit unit is configured to activate the first word line, the second circuit unit is configured to control a moving current supplied from one of the first and fourth signal generators to an other of the first and fourth signal generator via the magnetic structure, and the moving current is supplied between the buffer track and one of the plurality of storage tracks.

* * * * *